US012656919B2

(12) United States Patent
Yun et al.

(10) Patent No.: US 12,656,919 B2
(45) Date of Patent: Jun. 16, 2026

(54) TRANSPARENT DISPLAY DEVICE

(71) Applicant: LG Display Co., Ltd., Seoul (KR)

(72) Inventors: JeongGi Yun, Paju-si (KR); Taehwan Kim, Paju-si (KR); Jonghan Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/921,367

(22) Filed: Oct. 21, 2024

(65) Prior Publication Data

US 2025/0044906 A1    Feb. 6, 2025

Related U.S. Application Data

(63) Continuation of application No. 18/058,238, filed on Nov. 22, 2022, now Pat. No. 12,153,768.

(30) Foreign Application Priority Data

Dec. 13, 2021    (KR) ........................ 10-2021-0177813

(51) Int. Cl.
*G06F 3/044* (2006.01)
*G06F 3/041* (2006.01)
(Continued)

(52) U.S. Cl.
CPC .......... *G06F 3/0446* (2019.05); *G06F 3/0412* (2013.01); *G06F 3/04164* (2019.05);
(Continued)

(58) Field of Classification Search
CPC . G06F 2203/04103; G06F 2203/04107; G06F 2203/04111; G06F 2203/04112; G06F 3/0412; G06F 3/04164; G06F 3/0443; G06F 3/0446; H10K 2102/3031; H10K 59/12; H10K 59/131; H10K 59/40
See application file for complete search history.

(56) References Cited

U.S. PATENT DOCUMENTS

| 2016/0149156 A1 | 5/2016 | Kim et al. |
| 2016/0349899 A1* | 12/2016 | Hwang ............... G06F 3/04164 |

(Continued)

FOREIGN PATENT DOCUMENTS

| CN | 113050820 A | 6/2021 |
| KR | 20160054720 A | 5/2016 |

(Continued)

*Primary Examiner* — Robin J Mishler
(74) *Attorney, Agent, or Firm* — Seed Intellectual Property Law Group LLP

(57) ABSTRACT

Disclosed is a transparent display device comprising a substrate including a transmission area and a non-transmission area including a light emission area in which a light emitting element is disposed, a touch sensor disposed over the transmission area of the substrate, a touch sensor line disposed over the non-transmission area of the substrate and extended in a first direction, a touch sensor connection line extending in a second direction, a touch sensor contact portion disposed in the transmission area and configured to electrically connect the touch sensor and the touch sensor connection line to each other, and a touch sensor bridge pattern disposed between the touch sensor contact portion and the touch sensor connection line.

22 Claims, 10 Drawing Sheets

(51) Int. Cl.
  H10K 59/131 (2023.01)
  H10K 59/40 (2023.01)
(52) U.S. Cl.
  CPC ........... H10K 59/131 (2023.02); H10K 59/40
    (2023.02); *G06F 2203/04107* (2013.01); *G06F*
    *2203/04111* (2013.01)

(56) References Cited

U.S. PATENT DOCUMENTS

| | | | |
|---|---|---|---|
| 2017/0207288 A1 | 7/2017 | Kang et al. | |
| 2017/0213873 A1* | 7/2017 | Bok | H10K 59/131 |
| 2019/0155430 A1* | 5/2019 | Hwang | G06F 3/0416 |
| 2020/0066817 A1* | 2/2020 | Kim | H10K 59/87 |
| 2020/0136068 A1 | 4/2020 | Lee et al. | |
| 2022/0059798 A1* | 2/2022 | Song | H10K 59/122 |
| 2025/0044906 A1* | 2/2025 | Yun | G06F 3/04164 |

FOREIGN PATENT DOCUMENTS

| | | |
|---|---|---|
| KR | 20160066288 A | 6/2016 |
| KR | 20170089460 A | 8/2017 |
| KR | 20200063872 A | 6/2020 |

* cited by examiner

TRANSPARENT DISPLAY DEVICE

BACKGROUND

Technical Field

The present disclosure relates to a transparent display device.

Description of the Related Art

With the advancement of an information-oriented society, attentions and requirements for a display device configured to display image have been increased in various types. Accordingly, a display device such as a Liquid Crystal Display (LCD), an organic light emitting display (OLED), a Micro Light Emitting Diode (Micro LED), a quantum dot display device (QD), or the like is utilized.

Recently, research has been actively conducted on a transparent display device which displays an image to a user, transmits light, and allows a user to view an object or an image located behind the display device.

The transparent display device may include a plurality of touch sensors and a plurality of touch sensor lines to implement a touch function.

The above content of the background technology may be retained for a deduction of the present disclosure by inventors, or may be technology information learned by practice of embodiments of the present disclosure. However, the above content of the background technology may be not a prior art published to the general public before an application of the present disclosure.

BRIEF SUMMARY

The inventors have realized that forming a plurality of touch sensors and a plurality of touch sensor lines in the transparent display device is difficult or a process is complicated, thereby increasing the possibility of a defect in a manufacturing process.

In general, it is beneficial to perform a defect detection process for a manufacturing process of a display device in order to improve productivity, and to perform a repair process for the detected defects.

The inventors of the present disclosure have invented a transparent display device having a new structure, which recognizes that a contact area in a contact portion connecting a touch sensor and a touch sensor line is an important factor in order to more accurately detect a defect generated in a manufacturing process, and improves accuracy of defect detection through various experiments.

It is a technical benefit of the present disclosure to provide a transparent display device capable of increasing a contact area in a contact portion where a touch sensor and a touch sensor line are connected to each other.

In accordance with an aspect of the present disclosure, the above and other technical benefits can be accomplished by the provision of a transparent display device comprising a substrate including a transmission area and a non-transmission area including a light emission area in which a light emitting element is disposed, a touch sensor disposed over the transmission area of the substrate, a touch sensor line disposed over the non-transmission area of the substrate and extended in a first direction, a touch sensor connection line extending in a second direction, a touch sensor contact portion disposed in the transmission area and configured to electrically connect the touch sensor and the touch sensor connection line to each other, and a touch sensor bridge pattern disposed between the touch sensor contact portion and the touch sensor connection line.

In addition to the effects of the present disclosure as mentioned above, additional advantages and features of the present disclosure will be clearly understood by those skilled in the art from the above description of the present disclosure.

BRIEF DESCRIPTION OF THE SEVERAL VIEWS OF THE DRAWINGS

The above and other technical benefits, features and other advantages of the present disclosure will be more clearly understood from the following detailed description taken in conjunction with the accompanying drawings, in which.

DETAILED DESCRIPTION

Figure 1:
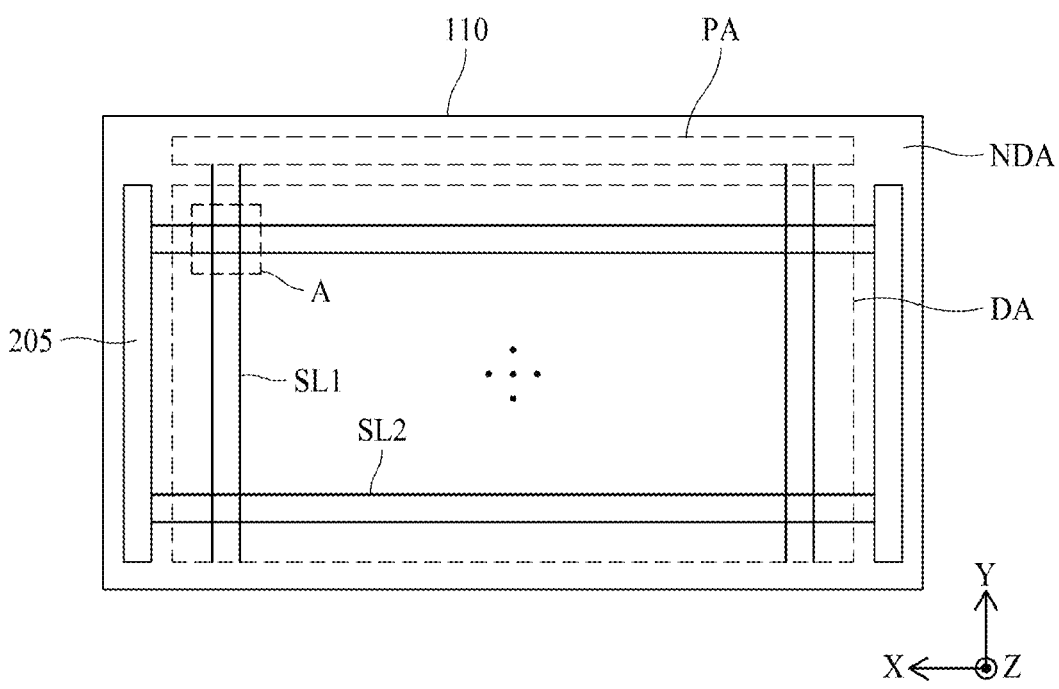
FIG. 1 is a plan view schematically illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to partition one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a preferred embodiment of a transparent display device according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

FIG. 1 is a plan view schematically illustrating a transparent display device according to one embodiment of the present disclosure.

Hereinafter, the X-axis represents a direction parallel to a scan line, the Y-axis represents a direction parallel to a data line, and the Z-axis represents a height direction of the transparent display device.

The transparent display device according to one embodiment of the present disclosure is implemented as an organic light emitting display OLED device, but may also be implemented as a liquid crystal display LCD device, a micro light emitting diode LED display device, a quantum dot QD display device, and etc.

Referring to FIG. 1, the transparent display device according to one embodiment of the present disclosure may include a transparent display panel 110 including a display area DA for displaying an image by pixels formed thereon, and a non-display area NDA on which an image is not displayed.

In the display area DA of the transparent display panel 110, there are first signal lines SL1, second signal lines SL2, and the pixels. In the non-display area NDA, there are a pad area PA for pads arranged thereon, and at least one gate driver 205.

The first signal lines SL1 may extend in the first direction (or Y-axis direction), and may overlap the second signal lines SL2 in the display area DA. The second signal lines SL2 may extend in the second direction (or X-axis direction). The pixels are disposed in the area where the first signal line SL1 and the second signal line SL2 overlap each other and are configured to emit predetermined or selected light in order to display an image.

The gate driver 205 may be connected to the scan line, to thereby supply a scan signal thereto. The gate driver 205 may be implemented in a gate driver in panel (GIP) method or a tape automated bonding (TAB) method on one outer side or both outer sides of the display area DA of the transparent display panel 110.

The pad area PA of the transparent display panel 110 may be electrically connected to a source drive integrated circuit, a circuit board, or a timing controller connected through a flexible circuit film.

For realization a touch function on the transparent display panel 110, a touch sensor line and a touch sensor may be further included in addition to the first signal line SL1, the second signal line SL2, and the pixel. A detailed description of the touch sensor line and the touch sensor will be described later with reference to FIGS. 2 to 10C.

Figure 2:
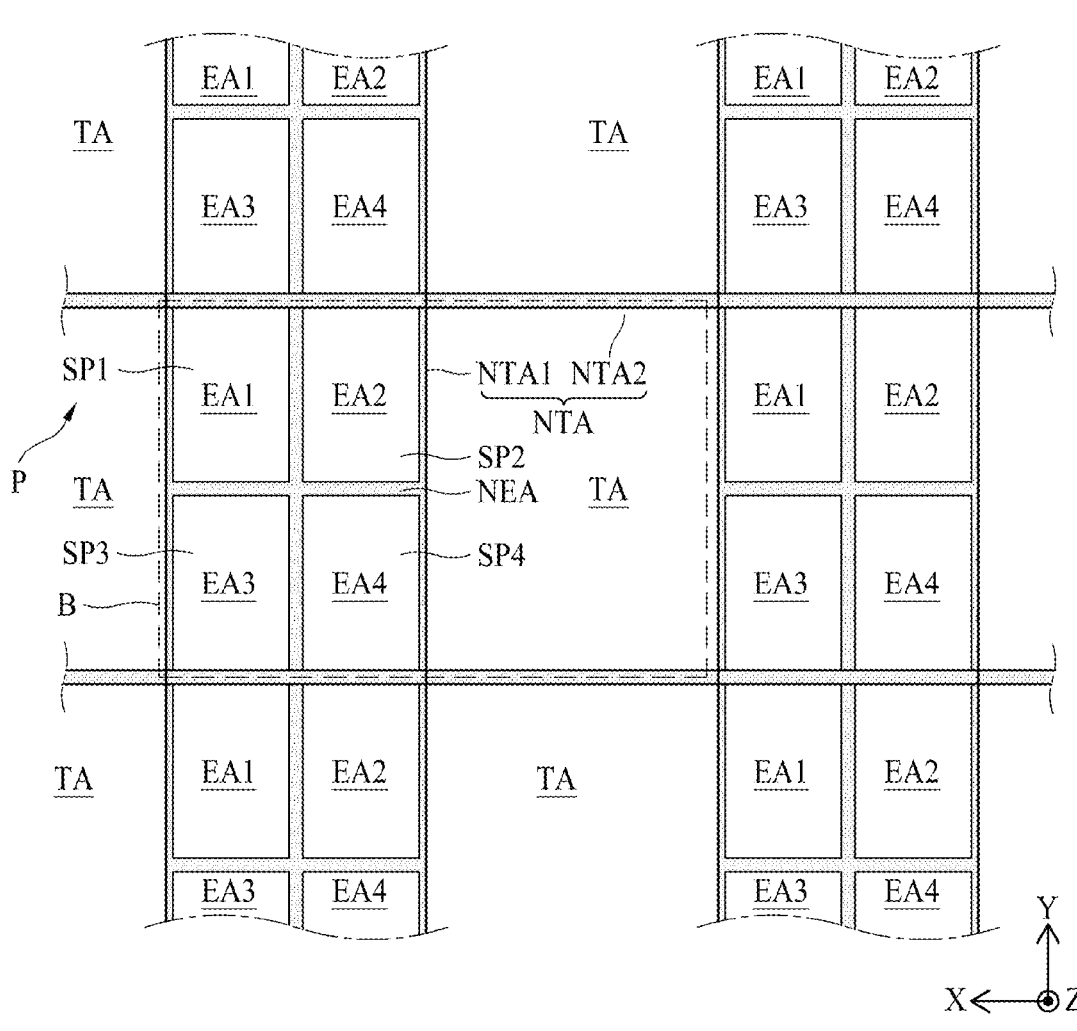
FIG. 2 is a plan view schematically illustrating an example of the pixel disposed in the area A of FIG. 1.
Figure 3:
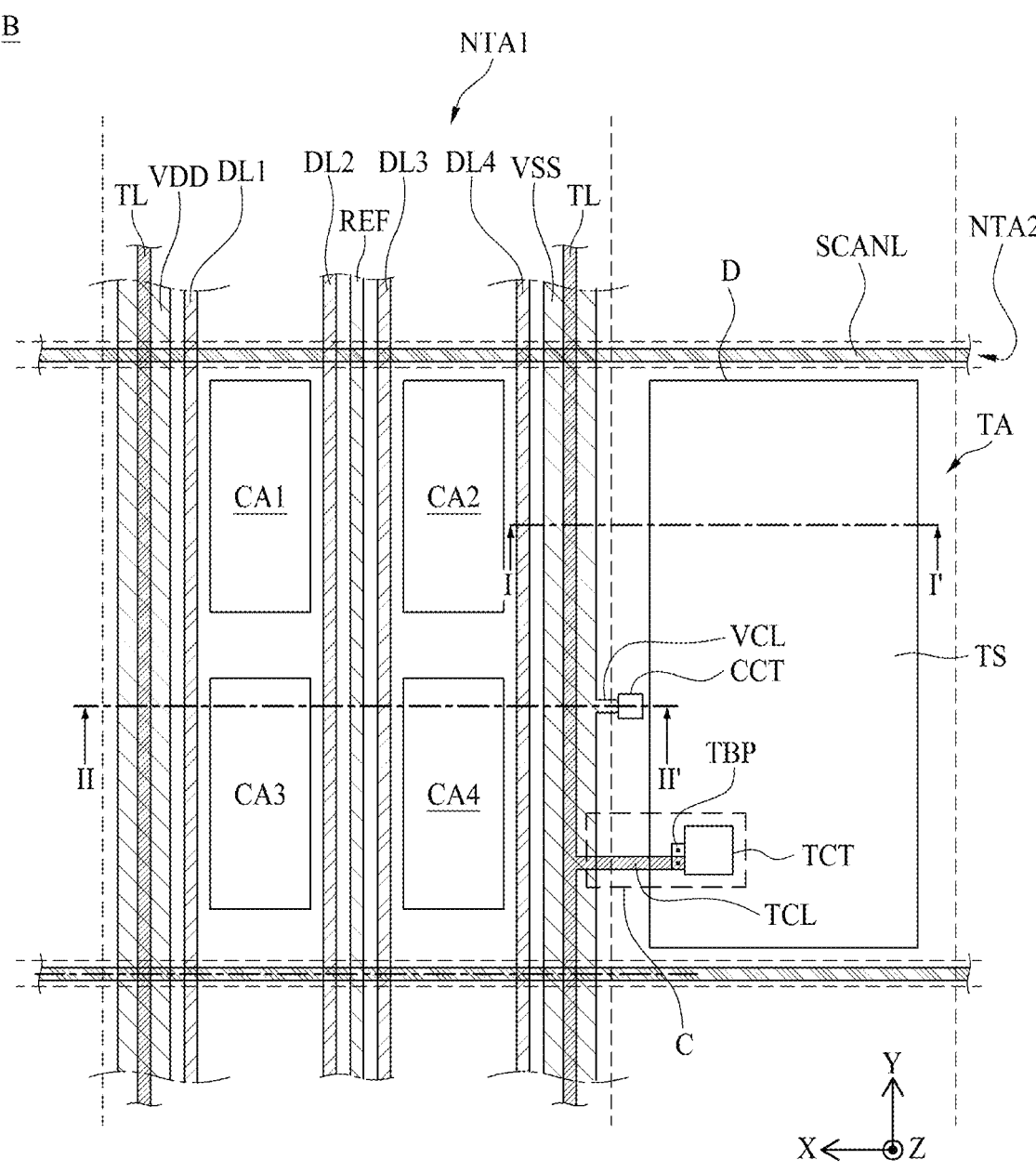
FIG. 3 is a plan view illustrating an example of signal lines, touch sensor lines, and touch sensor in the area B of FIG. 2.

FIG. 2 is a plan view schematically illustrating an example of the pixel disposed in the area A of FIG. 1, and FIG. 3 is a plan view illustrating an example of the signal lines, touch sensor lines, and touch sensor in the area B of FIG. 2.

Referring to FIGS. 2 and 3 in connection with FIG. 1, the display area DA may include a transmission area TA and a non-transmission area NTA, as shown in FIG. 2. The transmission area TA is the area which passes most of the light incident from the outside, and the non-transmission area NTA is the area which does not transmit most of the light incident from the outside. The users may see objects or background located at a rear surface (or back surface) of the transparent display panel 110 owing to the transmission areas TA.

The non-transmission area NTA may include a first non-transmission area NTA1, a second non-transmission area NTA2, and the pixels P.

The pixels P may be disposed at each intersection area where the first non-transmission area NTA1 and the second non-transmission area NTA2 cross each other, and may emit light to display an image. A light emission area EA may correspond to an area in which light is emitted from the pixel P.

Each of the pixels P may include a first subpixel SP1, a second subpixel SP2, a third subpixel SP3, and a fourth subpixel SP4, as shown in FIG. 2. The first subpixel SP1 includes a first light emission area EA1 emitting first color light, the second subpixel SP2 includes a second light emission area EA2 emitting second color light, the third subpixel SP3 may include a third light emission area EA3 emitting third color light, and the fourth subpixel SP4 may include a fourth light emission area EA4 emitting fourth color light. For example, the first to fourth light emission areas EA1, EA2, EA3, and EA4 may emit light of different colors. As one example, the first light emission area EA1 may emit green light, the second light emission area EA2 may emit red light, the third light emission area EA3 may emit blue light, and the fourth light emission area EA4 may emit white light, but not limited thereto. In addition, the arrangement order or arrangement form of each of the subpixels SP1, SP2, SP3, and SP4 may vary widely.

In the transparent display panel 110 according to one embodiment of the present disclosure, the pixel P is disposed between the adjacent transmission areas TA, and the pixel P may include the light emission area EA1, EA2, EA3, and EA4 in which a light emission element is disposed to emit light. Since the size of the non-transmission area NTA is small in the transparent display panel 110, a circuit element may be disposed while being overlapped with the light emission area EA1, EA2, EA3, and EA4. That is, the light emission area EA1, EA2, EA3, and EA4 may include a circuit area CA1, CA2, CA3, and CA4 in which the circuit element is disposed.

As shown in FIG. 3, in the transparent display panel 110 according to one embodiment of the present disclosure, as shown in FIG. 3, the touch sensor line TL is overlapped with or disposed adjacent to a pixel power line VDD or a common power line VSS while being not overlapped with the circuit areas CA1, CA2, CA3, and CA4 so that it is possible to reduce or minimize a parasitic capacitance of the touch sensor line TL caused by the circuit element and to reduce or minimize the area where the touch sensor line TL is disposed, thereby reducing the area of the non-transmission area NTA.

The first non-transmission area NTA1 may be extended in the first direction (or Y-axis direction) in the display area DA, and may include the light emission areas EA1, EA2, EA3, and EA4, and the first signal lines SL1 extending in the first direction may be disposed in the first non-transmission area NTA1. The plurality of first non-transmission areas NTA1 may be provided in the transparent display panel 110 according to one embodiment of the present disclosure, and the transmission area TA may be disposed between the two adjacent first non-transmission areas NTA1.

The first signal lines SL1 may include at least one of a pixel power line VDD, a common power line VSS, data lines DL1, DL2, DL3, DL4, a reference line REF, and a touch sensor line TL, as shown in FIG. 3.

The pixel power line VDD may supply a first power source to each of the subpixels SP1, SP2, SP3, and SP4 disposed in the display area DA. For example, the pixel power line VDD may supply the first power source to each driving thin film transistor disposed in the circuit areas CA1, CA2, CA3, and CA4 of the respective subpixels SP1, SP2, SP3, and SP4.

The common power line VSS may supply a second power source to a cathode electrode (or second electrode) of the subpixels SP1, SP2, SP3, and SP4 disposed in the display area DA. At this time, the second power source may be a common power source commonly supplied to the subpixels SP1, SP2, SP3, and SP4.

The common power line VSS may supply the second power source to the cathode electrode through a cathode contact portion CCT disposed between the common power line VSS and the touch sensor TS in the transmission area TA. A power connection line VCL may be disposed between the common power line VSS and the cathode contact portion CCT. One end of the power connection line VCL may be connected to the common power line VSS, and the other end of the power connection line VCL may be connected to the cathode contact portion CCT. For example, the power connection line VCL may extend from the common power line VSS and may be formed as one body with the cathode contact portion CCT. Meanwhile, the cathode electrode may be connected to the cathode contact portion CCT. As a result, the cathode electrode may be electrically connected to the common power line VSS through the cathode contact portion CCT and the power connection line VCL.

The data lines DL1, DL2, DL3, and DL4 may supply a data voltage to each of the subpixels SP1, SP2, SP3, and SP4 disposed in the display area DA. For example, the data lines DL1, DL2, DL3, and DL4 may supply the data voltage to the driving thin film transistors disposed in the circuit areas CA1, CA2, CA3, and CA4 of the respective subpixels SP1, SP2, SP3, and SP4.

The reference line REF may supply an initialization voltage (or sensing voltage) to each of the subpixels SP1, SP2, SP3, and SP4 disposed in the display area DA. The reference line REF may be disposed between the plurality of data lines DL1, DL2, DL3, and DL4. For example, the reference line REF may be disposed in the center of the plurality of data lines DL1, DL2, DL3, and DL4, that is, may be disposed between the second data line DL2 and the third data line DL3.

At least two touch sensor lines TL may be disposed in one first non-transmission area NTA1. When the plurality of touch sensor lines TL are disposed in the transmission area TA of the transparent display panel 110, a light transmittance may be lowered due to the plurality of touch sensor lines TL. For this reason, the touch sensor line TL may be disposed in the first non-transmission area NTA1 rather than the transmission area TA, preferably.

The touch sensor line TL may be disposed while being overlapped with at least one of the pixel power line VDD and the common power line VSS in the first non-transmission area NTA1, as shown in FIG. 3. For example, the touch sensor line TL, the pixel power line VDD, and the common power line VSS may be disposed in different layers. The touch sensor line TL may be disposed while being not overlapped with the circuit area CA1, CA2, CA3, and CA4 in which the circuit element is disposed, and may be disposed while being overlapped with at least one of the pixel power line VDD and the common power line VSS, or may be disposed adjacent to at least one of the pixel power line VDD and the common power line VSS. For example, the plurality of touch sensor lines may be disposed in one first non-transmission area NTA1. When the six touch sensor lines are disposed in one first non-transmission area NTA1, the three touch sensor lines may be overlapped with or may be disposed adjacent to the pixel power line VDD, or the other three touch sensor lines may be overlapped with or may be disposed adjacent to the common power line VSS, but not limited to this structure.

In the transparent display panel 110 according to one embodiment of the present disclosure, the touch sensor TS may be disposed in the transmission area TA. The touch sensor TS may cause a change in capacitance by a user's contact. A touch driver (not shown) may be connected to the touch sensor TS through the touch sensor line TL, to thereby sense the change in capacitance in the touch sensor TS.

The touch sensor TS may be separated from the cathode electrode of the pixel P by a disconnected portion D having an undercut region in the transmission area TA. The disconnected portion D may be formed to surround the edge of the touch sensor TS in the transmission area TA. That is, the disconnected portion D may define the shape and area of the touch sensor TS in the transmission area TA.

The touch sensor line TL may be electrically connected to the touch sensor TS through a touch sensor contact portion TCT disposed in the transmission area TA. The touch sensor contact portion TCT may be disposed in the touch sensor TS defined by the disconnected portion D in the transmission area TA. A touch sensor connection line TCL may be disposed between the touch sensor line TL and the touch sensor contact portion TCT. One end of the touch sensor connection line TCL extends from the touch sensor line TL and the other end of the touch sensor connection line TCL may be electrically connected to the touch sensor contact portion TCT. For example, the touch sensor connection line TCL and the touch sensor contact portion TCT may be disposed in different layers, and at least one inorganic insulating film may be disposed between the touch sensor connection line TCL and the touch sensor contact portion TCT. A touch sensor bridge pattern TBP may be disposed between the touch sensor connection line TCL and the touch sensor contact portion TCT. The touch sensor bridge pattern TBP may be disposed at at least one of the inorganic insulating films between the touch sensor connection line TCL and the touch sensor contact portion TCT, and electrically connect them between the touch sensor connection line TCL and the touch sensor contact portion TCT. Meanwhile, the touch sensor TS may be connected to the touch sensor contact portion TCT. As a result, the touch sensor TS may be electrically connected to the touch sensor line TL through the touch sensor contact portion TCT, the touch sensor bridge pattern TBP, and the touch sensor connection line TCL.

The second non-transmission area NTA2 may extend in the second direction (or X-axis direction) in the display area DA, at least a portion of the second non-transmission area NTA2 may be overlapped with the light emission areas EA1, EA2, EA3, and EA4, and the second signal lines SL2 extending in the second direction may be disposed in the second non-transmission area NTA2. The plurality of second non-transmission areas NTA2 may be provided in the transparent display panel 110 according to one embodiment of the present disclosure, and the transmission area TA may be disposed between the two adjacent second non-transmission areas NTA2.

The second signal lines SL2 may include the scan line SCANL, as shown in FIG. 3. The scan line SCANL may supply the scan signal to the subpixels SP1, SP2, SP3, and SP4 of the pixel P.

Hereinafter, a connection structure between the cathode electrode CE of the pixel P and the touch sensor TS and a connection structure between the cathode electrode CE of the pixel P and the common power line VSS in the transparent display panel 110 according to one embodiment of the present disclosure will be described in detail with reference to FIGS. 4 and 5.

Figure 4:
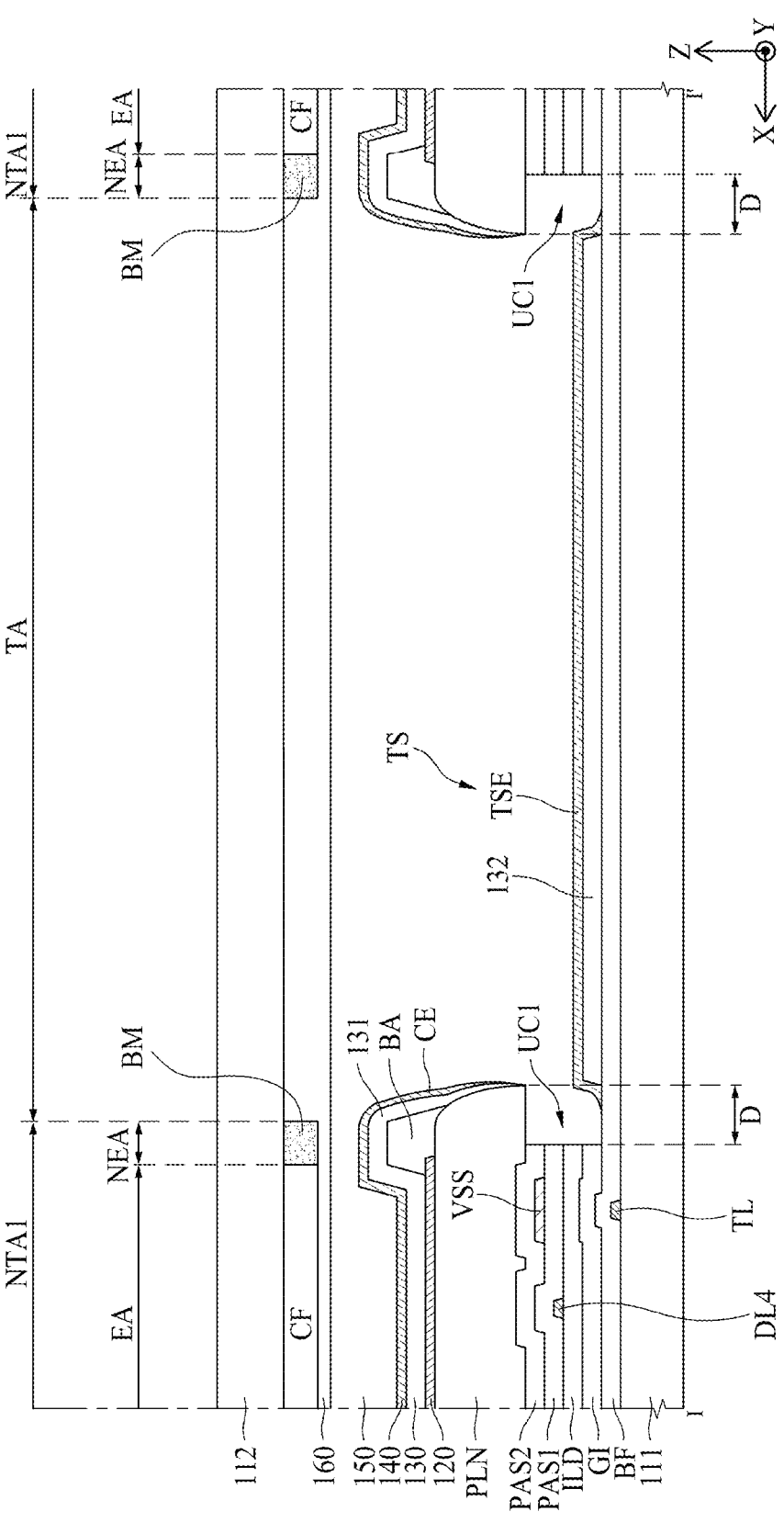
FIG. 4 is a cross-sectional view illustrating an example along I-I' of FIG. 3.
Figure 5:
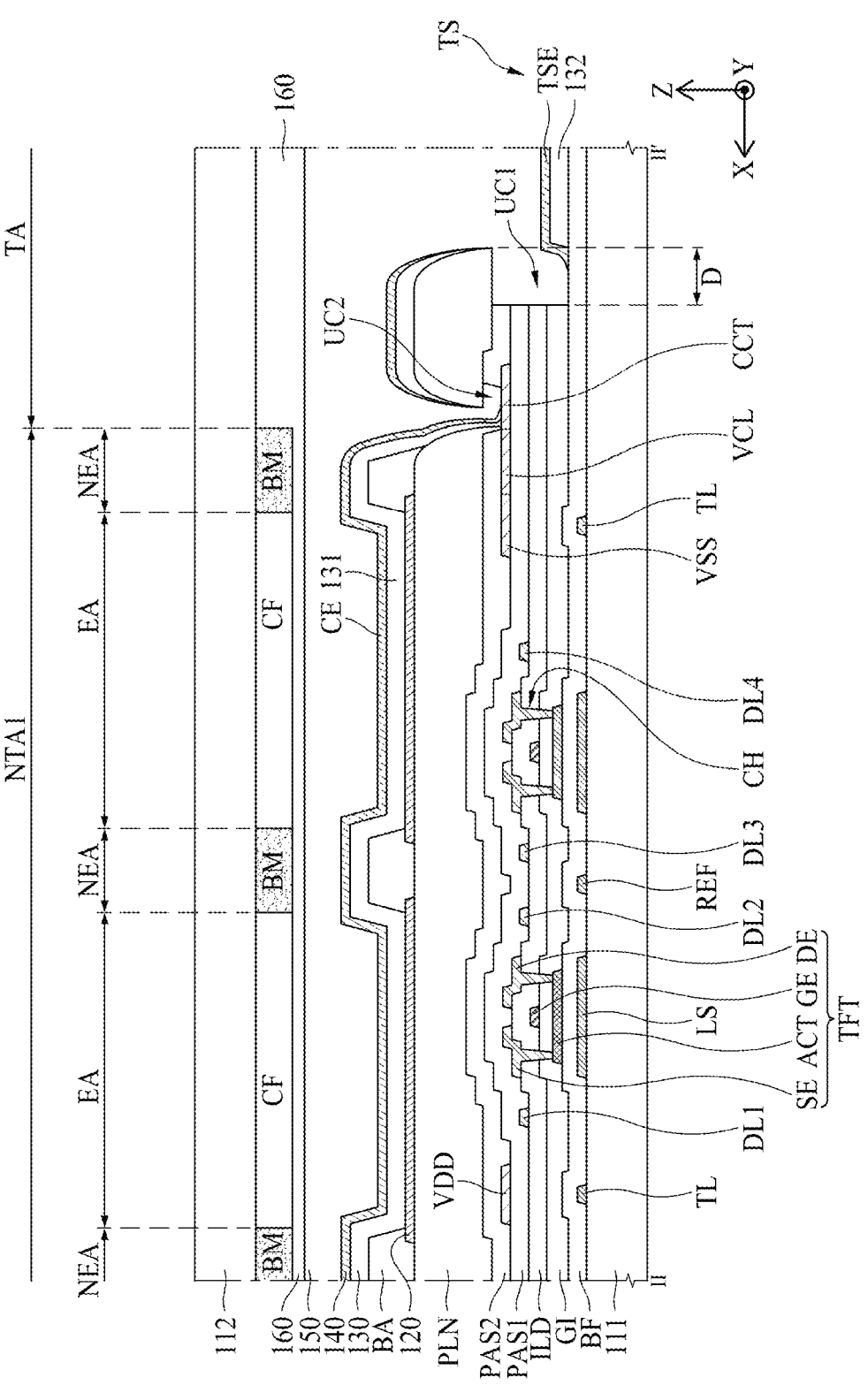
FIG. 5 is a cross-sectional view illustrating an example along II-II' of FIG. 3.

FIG. 4 is a cross-sectional view illustrating an example along I-I' of FIG. 3, and FIG. 5 is a cross-sectional view illustrating an example along II-II' of FIG. 3.

Referring to FIGS. 4 and 5 in connection with FIG. 3, a first substrate 111 of the transparent display panel 110 according to one embodiment of the present disclosure may include the non-transmission area NTA including the light emission area EA and the transmission area TA. The non-transmission area NTA may include the first non-transmission area NTA1 extending in the first direction (or Y-axis direction) and the second non-transmission area NTA2 extending in the second direction (or X-axis direction).

The first non-transmission area NTA1 may include the circuit areas CA1, CA2, CA3, and CA4 in which at least one thin film transistor TFT and a capacitor is disposed, and the first non-transmission area NTA1 may include the pixel power line VDD, the common power line VSS, the reference line REF, the data line DL, and the touch sensor line TL which are extended in the first direction and are disposed while being not overlapped with the circuit areas CA1, CA2, CA3, and CA4. The second non-transmission area NTA2 may include the scan line SCANL extending in the second direction.

At least one thin film transistor TFT may include a switching thin film transistor which is switched according to the scan signal supplied from the scan line SCANL and is configured to charge the data voltage supplied from the data line DL to the capacitor, a driving thin film transistor which is switched according to the data voltage charged in the capacitor and is configured to generate a data current from power source supplied from the pixel power line VDD and to supply the generated data current to a first electrode 120 of the subpixels SP1, SP2, SP3, and SP4, and a sensing thin film transistor which senses a threshold voltage deviation of the driving thin film transistor causing degradation of image quality in accordance with a sensing signal. The thin film transistors TFT may include an active layer ACT, a gate electrode GE, a first source/drain electrode SD1, and a second source/drain electrode SD2.

Specifically, a light shielding layer LS may be disposed over the first substrate 111. The light shielding layer LS serves to block external light incident on the active layer ACT of the thin film transistor TFT. The light shielding layer LS may include a single-layered structure or a multiple-layered structure of molybdenum Mo, aluminum Al, chromium Cr, gold Au, titanium Ti, nickel Ni, neodymium Nd, copper Cu, or their alloys.

In the transparent display panel 110 according to one embodiment of the present disclosure, at least a portion of the pixel power line VDD, the common power line VSS, the reference line REF, the data line DL, and the touch sensor line TL may be formed in the same layer as the light shielding layer LS. For example, as shown in FIG. 5, the touch sensor line TL and the reference line REF may include the same material as the light shielding layer LS and may be provided in the same layer as the light shielding layer LS, but not limited thereto.

A buffer film BF may be disposed over the first substrate 110 on which the light shielding layer LS, the touch sensor line TL, and the reference line REF are disposed. The buffer film BF is provided to protect the thin film transistor from moisture penetrating through the first substrate 111 vulnerable to moisture permeation, wherein the buffer film BF may include an inorganic film, for example, a silicon oxide film SiOx, a silicon nitride film SiNx, or a multi-layer thereof.

The active layer ACT may be disposed over the buffer film BF. The active layer ACT may include a silicon-based semiconductor material or an oxide-based semiconductor material.

A gate insulating film GI may be disposed over the buffer film BF on which the active layer ACT is disposed. The gate insulating film GI may be disposed in the non-transmission area NTA and may not be disposed in at least a portion of the transmission area TA in order to improve light transmittance in the transmission area TA and to form a first undercut region UC1. The gate insulating film GI may include an inorganic film, for example, a silicon oxide film SiOx, a silicon nitride film SiNx, or a multi-layer thereof.

The gate electrode GE may be disposed over the gate insulating film GI. The gate electrode GE may be formed in a single-layered structure or a multiple-layered structure of molybdenum Mo, aluminum Al, chromium Cr, gold Au, titanium Ti, nickel Ni, neodymium Nd, copper Cu, or their alloys.

In the transparent display panel 110 according to one embodiment of the present disclosure, at least a portion of the pixel power line VDD, the common power line VSS, the reference line REF, the data line DL, and the touch sensor line TL may be formed in the same layer as the gate electrode GE. For example, as shown in FIG. 3, the scan line SCANL disposed in the second non-transmission area NTA2 may include the same material as the gate electrode GE and may be provided in the same layer as the gate electrode GE, but not limited thereto.

An interlayer insulating film ILD may be disposed over the gate insulating film GI having the gate electrode GE and the scan line SCANL disposed thereon. The interlayer insulating film ILD may be disposed in the non-transmission area NTA and may not be disposed in at least a portion of the transmission area TA in order to improve light transmittance in the transmission area TA and to form the first undercut region UC1. The interlayer insulating film ILD may include an inorganic film, for example, a silicon oxide film SiOx, a silicon nitride film SiNx, or a multi-layer thereof.

The first source/drain electrode SD1 and the second source/drain electrode SD2 may be disposed over the interlayer insulating film ILD. The first source/drain electrode SD1 and the second source/drain electrode SD2 may be connected to the active layer ACT through a contact hole CH penetrating the gate insulating film GI and the interlayer insulating film ILD. The first source/drain electrode SD1 and the second source/drain electrode SD2 may be formed in a single-layered structure or a multiple-layered structure of molybdenum Mo, aluminum Al, chromium Cr, gold Au, titanium Ti, nickel Ni, neodymium Nd, copper Cu, or their alloys.

In the transparent display panel 110 according to one embodiment of the present disclosure, at least a portion of the pixel power line VDD, the common power line VSS, the reference line REF, the data line DL, and the touch sensor line TL may be formed in the same layer as the first source/drain electrode SD1 and the second source/drain electrode SD2. For example, as shown in FIG. 5, the data line DL may be formed of the same material as the first source/drain electrode SD1 and the second source/drain electrode SD2 and may be provided in the same layer as the first source/drain electrode SD1 and the second source/drain electrode SD2, but not limited thereto.

A first passivation film PAS1 for insulating the thin film transistor TFT may be disposed over the interlayer insulating film ILD on which the first source/drain electrode SD1, the second source/drain electrode SD2, and the data line DL are disposed. The first passivation film PAS1 may be disposed in the non-transmission area NTA and may not be disposed in at least a portion of the transmission area TA in order to improve light transmittance in the transmission area TA and to form the first undercut region UC1. The first passivation film PAS1 may include an inorganic film, for example, a silicon oxide film SiOx, a silicon nitride film SiNx, or a multi-layer thereof.

In the transparent display panel 110 according to one embodiment of the present disclosure, at least a portion of the pixel power line VDD, the common power line VSS, the reference line REF, the data line DL, and the touch sensor line TL may be formed on the first passivation film PAS1. For example, as shown in FIG. 5, the pixel power line VDD and the common power line VSS may be disposed over the first passivation film PAS1.

Also, in the transparent display panel 110 according to one embodiment of the present disclosure, as shown in FIG. 5, the pixel power line VDD and the common power line VSS may be overlapped with or disposed adjacent to the touch sensor line TL. The plurality of touch sensor lines TL may be disposed in the first non-transmission area NTA1. For example, when the six touch sensor lines TL are disposed, the pixel power line VDD may be overlapped with or disposed adjacent to the three touch sensor lines, and the common power line VSS may be overlapped with or disposed adjacent to the other three touch sensor lines, but not limited thereto.

Also, in the transparent display panel 110 according to one embodiment of the present disclosure, as shown in FIG. 5, the cathode contact portion CCT and the power connection line VCL may be formed of the same material as the pixel power line VDD and the common power line VSS and may be provided in the same layer as the pixel power line VDD and the common power line VSS, as shown in FIG. 5. One end of the power connection line VCL may be connected to the common power line VSS and the other end of the power connection line VCL may be connected to the cathode contact portion CCT. For example, the power connection line VCL may extend from the common power line VSS and may be formed as one body with the cathode contact portion CCT. Also, at least a portion of an upper surface of the cathode contact portion CCT is exposed by the second undercut region UC2, and the cathode electrode CE may be connected to the exposed upper surface of the cathode contact portion CCT. The cathode contact portion CCT may transmit power supplied from the common power line VSS to the cathode electrode CE through the power connection line VCL.

A second passivation film PAS2 may be disposed over the first passivation film PAS1 on which the pixel power line VDD, the common power line VSS, the power connection line VCL, and the cathode contact portion CCT are disposed. The second passivation film PAS2 may be disposed in the non-transmission area NTA and may not be disposed in at least a portion of the transmission area TA in order to improve light transmittance in the transmission area TA and to form the first undercut region UC1. The second passivation film PAS2 may include an inorganic film, for example, a silicon oxide film SiOx, a silicon nitride film SiNx, or a multi-layer thereof. In addition, the second passivation film PAS2 may be formed such that at least a portion of the cathode contact portion CCT is exposed for the formation of the second undercut region UC2.

A planarization film PLN may be disposed over the second passivation film PAS2, to thereby planarize a step difference caused by the thin film transistor TFT and the plurality of signal lines. The planarization film PLN may be disposed in the non-transmission area NTA and may not be disposed in at least a portion of the transmission area TA in order to improve light transmittance in the transmission area TA and to form the first undercut region UC1. The planarization film PLN may include an organic film such as acrylic resin, epoxy resin, phenolic resin, polyamide resin, and polyimide resin.

In the transparent display panel 110 according to one embodiment of the present disclosure, the first undercut region UC1 may be formed by using the planarization film PLN and the plurality of inorganic insulating films, for example, the gate insulating film GI, the interlayer insulating film ILD, the first passivation film PAS1, and the second passivation film PAS2. Specifically, the first undercut region UC1 may be formed such that the planarization film PLN protrudes more than the plurality of inorganic insulating films in the direction of the transmission area TA, for example, the gate insulating film GI, the interlayer insulating film ILD, the first passivation film PAS1, and the second passivation film PAS2. Accordingly, the first undercut region UC1 exposes at least a portion of the lower surface of the planarization film PLN, and the plurality of inorganic insulating films are not provided below the exposed lower surface of the planarization film PLN, to thereby form the disconnected portion D which is a space between the buffer film BF and the exposed lower surface of the planarization film PLN. The first undercut region UC1 may be formed by a wet etching process.

The disconnected portion D having the first undercut region UC1 may be disposed in the transmission area TA and may have a substantially planar closed loop shape. For example, the disconnected portion D may be formed to surround the edge of the touch sensor TS in the transmission area TA. That is, the disconnected portion D may define the shape and area of the touch sensor TS in the transmission area TA.

In the transparent display panel 110 according to one embodiment of the present disclosure, a light emitting layer 130 and a second electrode 140 may be separated between the non-transmission area NTA and the transmission area TA by the disconnected portion D having the first undercut region UC1. Specifically, the light emitting layer 130 may be divided into a light emitting layer 131 disposed in the non-transmission area NTA and a light emitting layer 132 disposed in the transmission area TA by the disconnected portion D. Also, the second electrode 140 may be divided into a second electrode CE disposed in the non-transmission area NTA and a second electrode TSE disposed in the transmission area TA by the disconnected portion D. Herein, the second electrode CE disposed in the non-transmission area NTA may be a cathode electrode CE constituting the light emitting element, and the second electrode TSE disposed in the transmission area TA may be a touch sensor electrode TSE for the touch sensor TS.

In the transparent display panel 110 according to one embodiment of the present disclosure, the disconnected portion D having the first undercut region UC1 is formed by the planarization film PLN and the plurality of inorganic insulating films so that it is possible to prevent lowering of light transmittance by the first undercut region UC1.

In the transparent display panel 110 according to one embodiment of the present disclosure, the second undercut region UC2 is formed by using the planarization film PLN and the second passivation film PAS2. Specifically, the second undercut region UC2 may be formed such that the planarization film PLN protrudes more than the second passivation film PAS2 in the direction in which the common power line VSS is disposed. Accordingly, the second undercut region UC2 may expose at least a portion of the lower surface of the planarization film PLN, and the second passivation film PAS2 is not provided below the exposed lower surface of the planarization film PLN, whereby at least a portion of the upper surface of the cathode contact portion CCT may be exposed. The second undercut region UC2 may be disposed outside the portion where the first undercut region UC1 is formed in the transmission area TA. For example, the second undercut region UC2 may be disposed between the first undercut region UC1 and the light emission area EA.

In the transparent display panel 110 according to one embodiment of the present disclosure, the cathode electrode CE may be connected to the cathode contact portion CCT by the second undercut region UC2. In detail, at least a portion of the upper surface of the cathode contact portion CCT may be exposed by the second undercut region UC2. According as the cathode electrode CE is in direct contact to the exposed upper surface of the cathode contact portion CCT, the cathode electrode CE may be connected to the cathode contact portion CCT.

The light emitting element including the first electrode 120, the light emitting layer 130, and the second electrode CE may be disposed over the planarization film PLN, and a bank BA may be disposed over the planarization film PLN.

The first electrode 120 may be disposed over the planarization film PLN for each of the subpixels SP1, SP2, SP3, and SP4. The first electrode 120 is not disposed in the transmission area TA. The first electrode 120 may be connected to the driving thin film transistor TFT. The first electrode 120 may be connected to one of the first source/drain electrode SD1 and the second source/drain electrode SD2 of the driving thin film transistor TFT through a contact hole (not shown) penetrating the planarization film PLN and the first passivation film PAS1 and the second passivation film PAS2. For example, the first electrode 120 may be formed of a metal material having high reflectance, such as a stack structure of aluminum and titanium (Ti/Al/Ti), a stack structure of aluminum and ITO (ITO/Al/ITO), Ag alloy, a stack structure of Ag alloy and ITO (ITO/Ag alloy/ITO), MoTi alloy, and a stack structure of MoTi alloy and ITO (ITO/MoTi alloy/ITO alloy). The Ag alloy may be an alloy of silver Ag, palladium Pd, and copper Cu. The MoTi alloy may be an alloy of molybdenum Mo and titanium Ti. The first electrode 120 may be an anode electrode.

The bank BA may be disposed over the planarization film PLN. Also, the bank BA may be formed to overlay the edge of the first electrode 120 and to expose a portion of the first electrode 120. Accordingly, the bank BA prevents a current from being concentrated at an end of the first electrode 120, to thereby prevent degradation of emission efficiency.

The bank BA may be adjacent the light emission areas EA1, EA2, EA3, and EA4 of the respective subpixels SP1, SP2, SP3, and SP4. The light emission areas EA1, EA2, EA3, and E4 of the respective subpixels SP1, SP2, SP3, and SP4 may correspond to the area for the light emission in which the first electrode 120, the light emitting layer 130, and the cathode electrode CE are stacked in sequence and holes from the first electrode 120 and electrons from the cathode electrode CE are coupled to each other in the light emitting layer 130. In this case, the area in which the bank BA is formed does not emit light, so that it becomes a non-emission area NEA. Meanwhile, the area where the bank BA is not formed and the first electrode 120 is exposed may be the light emission area EA. For example, the bank 125 may include an organic film of acrylic resin, epoxy resin, phenolic resin, polyamide resin, or polyimide resin.

The light emitting layer 130 may be disposed over the first electrode 120. For example, the light emitting layer 130 may be a common layer commonly formed on the subpixels SP1, SP2, SP3, and SP4. Herein, the light emitting layer 130 may be a white light emitting layer for emitting white light. As another example, the light emitting layer 130 may be formed by each of the subpixels SP1, SP2, SP3, and SP4. For example, a green light emitting layer for emitting green light is formed in the first subpixel SP1, a red light emitting layer for emitting red light is formed in the second subpixel SP2, a blue light emitting layer for emitting blue light is formed in the third subpixel SP3, and a white light emitting layer for emitting white light may be formed in the fourth subpixel SP4. In this case, the light emitting layer 130 may not be formed in the transmission area TA.

The light emitting layer 130 may be separated between the non-transmission area NTA and the transmission area TA by the disconnected portion D having the first undercut region UC1. That is, the light emitting layer 130 may be divided into the light emitting layer 131 disposed in the non-transmission area NTA and the light emitting layer 132 disposed in the transmission area TA by the first undercut region UC1.

The second electrode 140 may be disposed over the light emitting layer 130 and the bank 125. If the second electrode 140 is deposited over the entire surface, the second electrode 140 may be disconnectedly provided between the non-transmission area NTA and the transmission area TA by the first undercut region UC1. Specifically, the second electrode 140 may be divided into the second electrode CE disposed in the non-transmission area NTA and the second electrode TSE disposed in the transmission area TA by the first undercut region UC1.

In this case, the second electrode CE disposed in the non-transmission area NTA may be the cathode electrode CE for the light emitting element. The cathode electrode CE is connected to the cathode contact portion CCT exposed by the second undercut region UC2, whereby the cathode electrode CE may receive power from the common power line VSS. The cathode electrode CE may be a common layer which is commonly formed on the subpixels SP1, SP2, SP3, and SP4 and is configured to apply the same voltage thereto.

Also, the second electrode TSE disposed in the transmission area TA may be the touch sensor electrode TSE for the touch sensor TS. The touch sensor electrode TSE may be connected to the touch sensor line TL through a touch sensor contact portion TCT disposed in the transmission area TA, to thereby provide the change in capacitance.

The second electrode 140 including the cathode electrode CE and the touch sensor electrode TSE may include transparent conductive material TCO such as ITO, IZO, or a semi-transmissive conductive material such as magnesium Mg, silver Ag, or an alloy of magnesium Mg and silver Ag. When the second electrode 140 is formed of the semi-transmissive conductive material, a light emission efficiency may be improved by a micro cavity.

An encapsulation film 150 may be formed over the light emitting element and the touch sensor TS. The encapsulation film 150 may be provided on the cathode electrode CE and the touch sensor electrode TSE while being configured to overlay the cathode electrode CE and the touch sensor electrode TSE.

The encapsulation film 150 prevents oxygen or moisture from penetrating into the light emitting layer 130, the cathode electrode CE, and the touch sensor electrode TSE. To this end, the encapsulation film 150 may include at least one inorganic film and at least one organic film.

A color filter CF may be disposed over the encapsulation film 150. The color filter CF may be disposed over one surface of a second substrate 112 confronting the first substrate 111. In this case, the first substrate 111 on which the encapsulation film 150 is disposed and the second substrate 112 on which the color filter CF is disposed may be bonded to each other by a separate adhesive layer 160. The adhesive layer 160 may be an optically clear resin layer OCR or an optically clear adhesive film OCA.

The color filter CF may be patterned by each of the subpixels SP1, SP2, SP3, and SP4. Specifically, the color filter CF may include a first color filter, a second color filter, and a third color filter. The first color filter may be disposed to correspond to the light emission area EA1 of the first subpixel SP1 and may be a green color filter which transmits green light. The second color filter may be disposed to correspond to the light emission area EA2 of the second subpixel SP2 and may be a red color filter which transmits red light. The third color filter may be disposed to correspond to the light emission area EA3 of the third subpixel SP3, and may be a blue color filter which transmits blue light.

A black matrix BM may be disposed between each of the color filters CF. The black matrix BM may be disposed between each of the subpixels SP1, SP2, SP3, and SP4, to thereby prevent a color mixture between the adjacent subpixels SP1, SP2, SP3, and SP4. In addition, the black matrix BM may prevent light incident from the outside from being reflected on the plurality of wirings, e.g., scan lines, data lines, pixel power lines, common power lines, reference lines, etc., disposed between each of the subpixels SP1, SP2, SP3, and SP4.

In the transparent display panel 110 according to one embodiment of the present disclosure, the touch sensor electrode TSE of the touch sensor TS and the cathode electrode CE of the light emitting element may be formed in the same layer by the use of first undercut region UC1. The transparent display panel 110 according to one embodiment of the present disclosure enables a simple touch process and does not need to add a separate mask for the touch sensor electrode TSE.

Also, in the transparent display panel 110 according to one embodiment of the present disclosure, the first undercut region UC1 is formed by the planarization film PLN and the plurality of inorganic insulating films so that it is possible to form the first undercut region UC1 without loss of light transmittance.

In addition, in the transparent display panel 110 according to one embodiment of the present disclosure, the touch sensor line TL is disposed under the light emitting element, thereby preventing the light emission efficiency of the pixel P from being deteriorated by the touch sensor line TL.

Also, in the transparent display panel 110 according to one embodiment of the present disclosure, the touch sensor line TL is overlapped with or disposed adjacent to the pixel power line VDD and the common power line VSS while being not overlapped with the circuit areas CA1, CA2, CA3, and CA4 so that it is possible to reduce or minimize a parasitic capacitance of the touch sensor line TL caused by a circuit element and to reduce or minimize the area of the non-transmission area NTA by reducing or minimizing the area where the touch sensor line TL is disposed.

Hereinafter, the connection structure of the touch sensor TS and the touch sensor line TL through the touch sensor contact portion TCT in the transparent display panel 110 according to the embodiment of the present disclosure will be described in detail with reference to FIGS. 6A to 10C.

First Embodiment

Figure 6A:
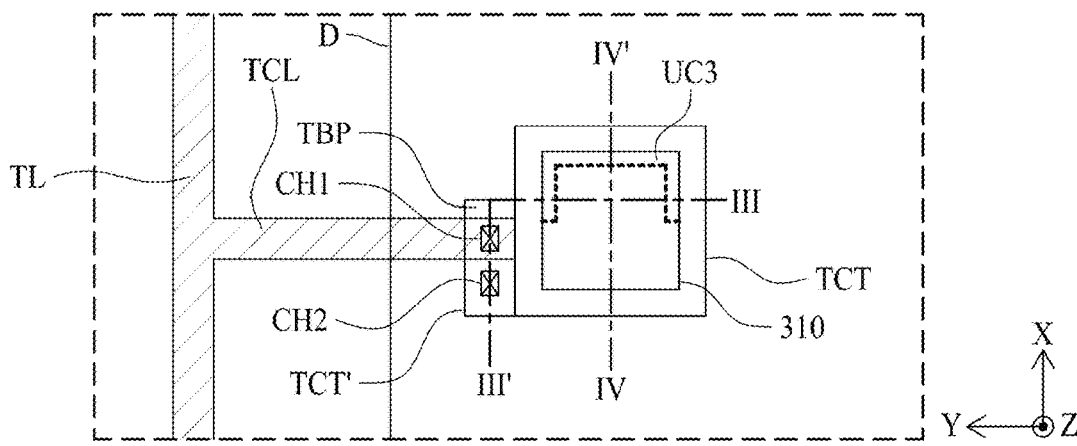
FIG. 6A is a plan view illustrating the first embodiment of a touch sensor contact portion included in the area C of FIG. 3.
Figure 6B:
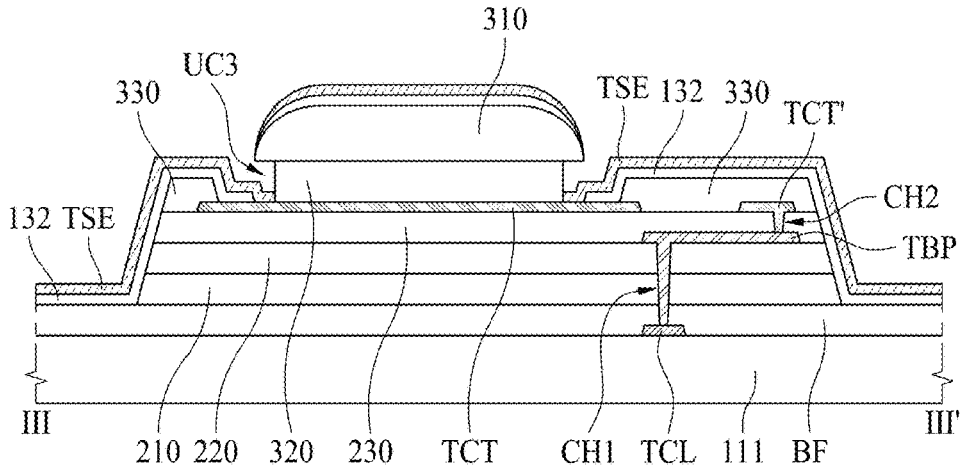
FIG. 6B is a cross-sectional view illustrating an example along III-III' of FIG. 6A.
Figure 6C:
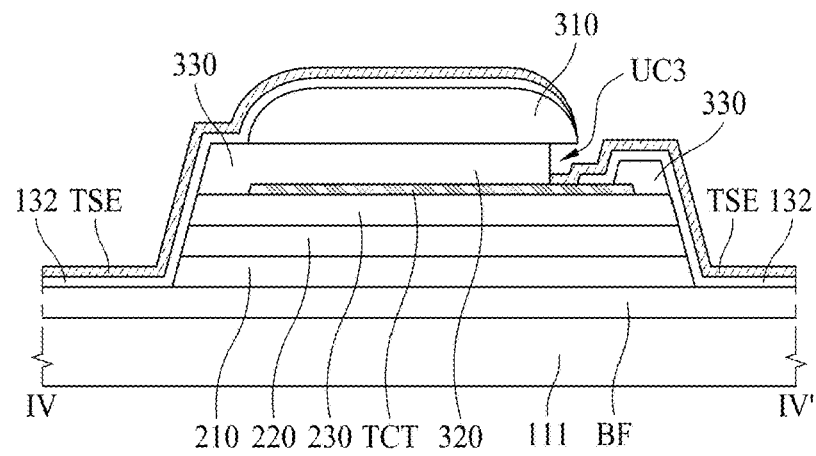
FIG. 6C is a cross-sectional view illustrating an example along IV-IV' of FIG. 6A.

FIG. 6A is a plan view illustrating the first embodiment of the touch sensor contact portion included in the area C of FIG. 3, FIG. 6B is a cross-sectional view illustrating an example along III-III' of FIG. 6A, and FIG. 6C is a cross-sectional view illustrating an example along IV-IV' of FIG. 6A.

Referring to FIGS. 6A to 6C in connection with FIGS. 3 to 5, the transparent display panel 110 according to the first embodiment of the present disclosure may include a touch sensor line TL, a touch sensor connection line TCL, a touch sensor contact portion TCT, a touch sensor bridge pattern TBP, a plurality of support pattern films 210, 220, and 230, an eaves pattern portion 310, an eaves support portion 320, and a protective pattern film 330. The eaves pattern portion 310 and the eaves support portion 320 may be referred to collectively as a "contact structure."

In the non-transmission area NTA, as shown in FIGS. 3 to 5, the touch sensor line TL may be disposed over the first substrate 111 and may be disposed while being overlapped with at least one of the pixel power line VDD and the common power line VSS. For example, the touch sensor line TL may be formed of the same material as the light shielding layer LS and may be provided in the same layer as the light shielding layer LS, but not limited thereto.

The touch sensor connection line TCL may be disposed over the first substrate 111, one end of the touch sensor connection line TCL is connected to the touch sensor line TL, and the other end of the touch sensor connection line TCL is extended in the direction in which the touch sensor contact portion TCT is disposed and is overlapped with the touch sensor contact portion TCT. For example, the touch sensor connection line TCL may extend from the touch sensor line TL as one body type, and may be formed in the portion overlapped with the touch sensor contact portion TCT. For example, the touch sensor connection line TCL may be formed of the same material as the light shielding layer LS and may be provided in the same layer as the light shielding layer LS, but is not limited thereto.

A buffer film BF may be disposed over the first substrate 111 on which the touch sensor line TL and the touch sensor connection line TCL are disposed.

The touch sensor contact portion TCT may be disposed in the touch sensor TS defined by the disconnected portion D in the transmission area TA. The touch sensor contact portion TCT may be disposed over the plurality of support pattern films 210, 220, and 230 overlapped with the touch sensor contact portion TCT in the transmission area TA. For example, the touch sensor contact portion TCT may be formed of the same material as the pixel power line VDD and the common power line VSS and may be provided in the same layer as the pixel power line VDD and the common power line VSS, but not limited thereto.

The touch sensor bridge pattern TBP may be disposed between the touch sensor contact portion TCT and the touch sensor connection line TCL. One end of the touch sensor bridge pattern TBP may be overlapped with the touch sensor connection line TCL and the other end of the touch sensor bridge pattern TBP may be overlapped with the touch sensor contact portion TCT. The touch sensor bridge pattern TBP may be disposed at one of the plurality of support pattern films 210, 220, and 230, and may electrically connect the touch sensor connection line TCL and the touch sensor contact portion TCT to each other. One end of the touch sensor bridge pattern TBP may be electrically connected to the touch sensor connection line TCL and the other end of the touch sensor bridge pattern TBP may be electrically connected to the touch sensor contact portion TCT. For example, the touch sensor bridge pattern TBP may be formed of the same material as the first source/drain electrode SD1 and the second source/drain electrode SD2 and may be provided in the same layer as the first source/drain electrode SD1 and the second source/drain electrode SD2, but not limited thereto.

The plurality of support pattern films 210, 220, and 230 may include an inorganic material. The plurality of support pattern films 210, 220, and 230 may be disposed over the buffer film BF of the first substrate 111. The plurality of support pattern films 210, 220, and 230 may be disposed in the portion at least partially overlapping the touch sensor contact portion TCT in the transmission area TA.

The first support pattern film 210 of the plurality of support pattern films 210, 220, and 230 may be disposed at the upper surface of the buffer film BF on which the touch sensor connection line TCL is disposed. At least a portion of the first support pattern film 210 may be overlapped with the touch sensor contact portion TCT in the transmission area TA, and the first support pattern film 210 may not be disposed in at least a portion of the transmission area TA for improvement of the light transmittance in the transmission area TA. For example, the first support pattern film 210 may be formed of the same material as the gate insulating film GI disposed in the non-transmission area NTA and may be provided in the same layer as the gate insulating film GI, but not limited thereto.

The second support pattern film 220 of the plurality of support pattern films 210, 220, and 230 may be disposed at the upper surface of the first support pattern film 210. At least a portion of the second support pattern film 220 may be overlapped with the touch sensor contact portion TCT in the transmission area TA, and the second support pattern film 220 may not be disposed in at least a portion of the transmission area TA for improvement of the light transmittance in the transmission area TA. For example, the second support pattern film 220 may be formed of the same material as the interlayer insulating film ILD disposed in the non-transmission area NTA and may be provided in the same layer as the interlayer insulating film ILD, but not limited thereto. The touch sensor bridge pattern TBP may be disposed over the second support pattern film 220. The touch sensor bridge pattern TBP may be connected to the touch sensor connection line TCL through a first contact hole CH1 penetrating the first support pattern film 210, the second support pattern film 220, and the buffer film BF.

The third support pattern film 230 of the plurality of support pattern films 210, 220, and 230 may be disposed at the upper surface of the second support pattern film 220 in which the touch sensor bridge pattern TBP is disposed. At least a portion of the third support pattern film 230 may be overlapped with the touch sensor contact portion TCT in the transmission area TA, and the third support pattern film 230 may not be disposed in at least a portion of the transmission area TA for improvement of the light transmittance in the transmission area TA. For example, the third support pattern film 230 may be formed of the same material as the first passivation film PAS1 disposed in the non-transmission area NTA and may be provided in the same layer as the first passivation film PAS1, but not limited thereto. The touch sensor contact portion TCT may be disposed over the third support pattern film 230. The touch sensor contact portion TCT may be connected to the touch sensor bridge pattern TBP through a second contact hole CH2 penetrating the third support pattern film 230.

Referring to FIGS. 6A to 6C, the touch sensor contact portion TCT (or touch sensor contact electrode) of the transparent display panel 110 according to the first embodiment of the present disclosure may be disposed over the plurality of support pattern films 210, 220, and 230. Over the touch sensor contact portion TCT, the caves pattern portion 310, the caves support portion 320, and the protective pattern film 330 may be disposed to form an undercut region UC3 which exposes at least a portion of the touch sensor contact portion TCT.

The caves pattern portion 310 may include an organic insulating material, and the caves support portion 320 and the protective pattern film 330 may be form of an inorganic insulating material. The caves pattern portion 310 may be formed of the same material as the planarization film PLN disposed in the non-transmission area NTA and may be provided in the same layer as the planarization film PLN disposed in the non-transmission area NTA. Also, the caves support portion 320 and the protective pattern film 330 may be formed of the same material as the second passivation film PAS2 disposed in the non-transmission area NTA and may be provided in the same layer as the second passivation film PAS2 disposed in the non-transmission area NTA, but not limited thereto.

The caves pattern portion 310 may be disposed over a portion of the touch sensor contact portion TCT. The caves pattern portion 310 is formed in an island pattern over the center of the touch sensor contact portion TCT, and the undercut region UC3 may be formed under a portion of the edge of the caves pattern portion 310. For example, the undercut region UC3 may be formed only under the edge located at the upper portion in the entire edge portions of the caves pattern portion 310, and the undercut region UC3 may not be formed at the remaining edge portions.

The caves support portion 320 is overlapped with the caves pattern portion 310 over the upper surface of the touch sensor contact portion TCT and is configured to support the caves pattern portion 310. Also, the protective pattern film 330 may be formed to overlay the edge of the touch sensor contact portion TCT. An exposed region for exposing at least a portion of the touch sensor contact portion TCT may be formed between the caves support portion 320 and the protective pattern film 330. The undercut region UC3 may be at least partially overlapped with the exposed region of the touch sensor contact portion TCT.

The caves support portion 320 and the protective pattern film 330 may be formed of the same material as the second passivation film PAS2 disposed in the non-transmission area NTA and may be provided in the same layer as the second passivation film PAS2 disposed in the non-transmission area NTA. For example, the caves support portion 320 and the protective pattern film 330 may be formed of the same material as the second passivation film PAS2 by a wet etching process, and the protective pattern film 330 may be formed at a height lower than or equal to a height of the caves support portion 320.

The caves support portion 320 and the protective pattern film 330 may be formed through a wet etching process for the area overlapping a portion of the edge of the caves pattern portion 310. The caves support portion 320 is etched to expose a portion of the upper surface of the touch sensor contact portion TCT. The caves support portion 320 is provided in such a way that the caves support portion 320 is inwardly recessed than the caves pattern portion 310 in the area overlapping a portion of the edge of the caves pattern portion 310. Thus, the protective pattern film 330 is not completely etched and is patterned to overlay the edge of the touch sensor contact portion TCT.

In the transparent display panel 110 according to the first embodiment of the present disclosure, as shown in FIGS. 6A to 6C, at least a portion of the upper surface of the touch sensor contact portion TCT is exposed by the undercut region UC3, and the touch sensor electrode TSE is in contact with the exposed upper surface of the touch sensor contact portion TCT.

The touch sensor contact portion TCT may be overlapped with the touch sensor bridge pattern TBP and may be connected to the touch sensor bridge pattern TBP through a second contact hole CH2 penetrating the third support pattern film 230. Also, the touch sensor bridge pattern TBP may be overlapped with the touch sensor connection line TCL and may be connected to the touch sensor connection line TCL through the first contact hole CH1 penetrating the first support pattern film 210, the second support pattern film 220, and the buffer film BF. As a result, the touch sensor electrode TSE is in direct contact to the upper surface of the touch sensor contact portion TCT through the undercut region UC3, whereby the touch sensor electrode TSE is connected to the touch sensor contact portion TCT and is configured to transmit a capacitance change of the touch sensor electrode TSE to the touch sensor line TL through the touch sensor bridge pattern TBP and the touch sensor connection line TCL.

In the transparent display panel 110 according to the first embodiment of the present disclosure, as shown in FIGS. 6A to 6C, the undercut region UC3 may be formed under a portion of the edge of the caves pattern portion 310. The undercut region UC3 may be formed in such a way that the caves support portion 320 corresponding to a portion of the edge of the caves pattern portion 310 is patterned more inwardly than the edge of the caves pattern portion 310. The undercut region UC3 may include a portion under a portion of the edge of the caves pattern portion 310 and a side surface of the caves support portion 320. An exposed region for exposing at least a portion of the touch sensor contact portion TCT may be formed between the caves support portion 320 having the undercut region UC3 and the protective pattern film 330. The exposed region of the touch sensor contact portion TCT may be formed in the periphery of a portion of the edge of the caves pattern portion 310 while being corresponding to the formation position of the undercut region UC3.

The light emitting layer 132 may be formed over the caves pattern portion 310 and the protective pattern film 330, and may be disconnectedly provided in the undercut region UC3 formed below a portion of the edge of the caves pattern portion 310 disposed above the exposed region of the touch sensor contact portion TCT. The light emitting layer 132 may be formed of a material having inferior step coverage. Accordingly, the light emitting layer 132 may not be formed in the exposed region of the touch sensor contact portion TCT overlapped with the undercut region UC3, thereby reducing or minimizing the area of the light emitting layer 132 disposed over the exposed region of the touch sensor contact portion TCT.

The touch sensor electrode TSE may be formed over the caves pattern portion 310 and the protective pattern film 330, and may be in contact with the exposed region of the touch sensor contact portion TCT, whereby the touch sensor electrode TSE may be electrically connected to the touch sensor contact portion TCT. The touch sensor electrode TSE may be formed of the same material as the cathode electrode CE having excellent step coverage. The touch sensor electrode TSE has greater step coverage than the light emitting layer 132, so that the light emitting layer 132 may not be formed and the touch sensor electrode TSE may be formed to the exposed upper surface of the touch sensor contact portion TCT. Accordingly, the light emitting layer 132 is not in contact with the touch sensor contact portion TCT overlapped with the undercut region UC3, and the touch sensor contact portion TCT is exposed. However, the touch sensor electrode TSE is not overlaid by the light emitting layer 132, and is in direct contact with the exposed upper surface of the touch sensor contact portion TCT, and is electrically connected to the touch sensor contact portion TCT.

Second Embodiment

Figure 7A:
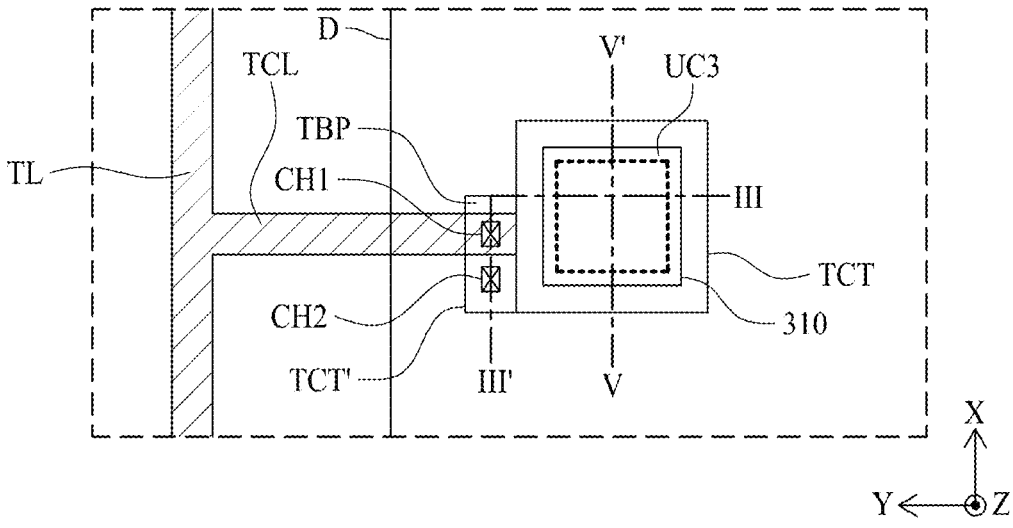
FIG. 7A is a plan view illustrating the second embodiment of a touch sensor contact portion included in the area C of FIG. 3.
Figure 7B:
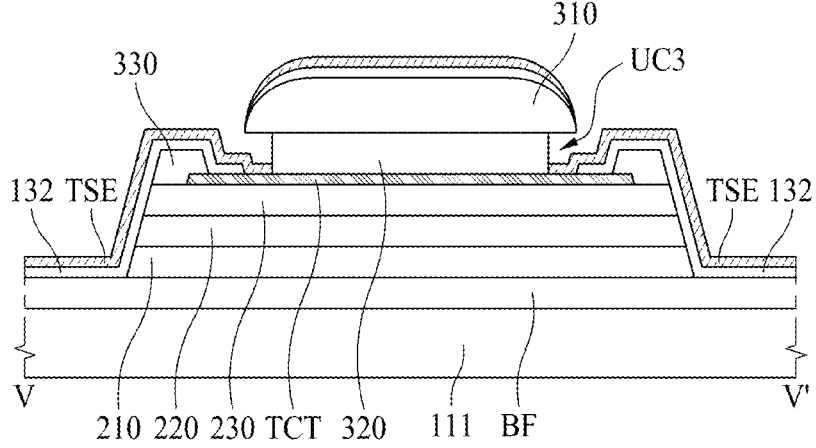
FIG. 7B is a cross-sectional view illustrating an example along V-V' of FIG. 7A.

FIG. 7A is a plan view illustrating the second embodiment of the touch sensor contact portion included in the area C of FIG. 3, and FIG. 7B is a cross-sectional view illustrating an example along V-V' of FIG. 7A. The cross-sectional view along III-III' in FIG. 7A is substantially the same as that of FIG. 6B, whereby a detailed description for the cross-sectional view along III-III' is omitted.

Referring to FIGS. 7A and 7B in connection with FIGS. 3 to 5 and FIG. 6B, the transparent display panel 110 according to the second embodiment of the present disclosure may include a touch sensor line TL, a touch sensor connection line TCL, a touch sensor contact portion TCT, a touch sensor bridge pattern TBP, a plurality of support pattern films 210, 220, and 230, an caves pattern portion 310, an eaves support portion 320, and a protective pattern film 330.

The transparent display panel 110 according to the second embodiment of the present disclosure shown in FIGS. 7A and 7B has substantially the same configurations as those of the transparent display panel 110 according to the first embodiment of the present disclosure shown in FIGS. 6A to 6C except that an undercut region UC3 is formed in a closed loop shape along the edge of the caves pattern portion 310, whereby a detailed description for the same configurations will be omitted.

Referring to FIGS. 7A and 7B, the touch sensor contact portion TCT (or touch sensor contact electrode) of the transparent display panel 110 according to the second embodiment of the present disclosure may be disposed over the plurality of support pattern films 210, 220, and 230. Over the touch sensor contact portion TCT, the caves pattern portion 310, the caves support portion 320, and the protective pattern film 330 may be disposed to form the undercut region UC3 which exposes at least a portion of the touch sensor contact portion TCT.

The caves pattern portion 310 may be disposed over a portion of the touch sensor contact portion TCT. The caves pattern portion 310 is formed in an island pattern over the center of the touch sensor contact portion TCT, and the undercut region UC3 may be formed under the edge of the caves pattern portion 310. For example, the undercut region UC3 formed in a closed loop shape may be formed along the entire edges of the caves pattern portion 310.

The caves support portion 320 is overlapped with the caves pattern portion 310 over the upper surface of the touch sensor contact portion TCT and is configured to support the caves pattern portion 310. Also, the protective pattern film 330 may be formed to overlay the edge of the touch sensor contact portion TCT. An exposed region for exposing at least a portion of the touch sensor contact portion TCT may be formed between the caves support portion 320 and the protective pattern film 330. The undercut region UC3 may be at least partially overlapped with the exposed region of the touch sensor contact portion TCT.

The caves support portion 320 and the protective pattern film 330 may be formed through a wet etching process for the area overlapping the edge of the caves pattern portion 310. The caves support portion 320 is etched to expose a portion of the upper surface of the touch sensor contact portion TCT. The caves support portion 320 is provided in such a way that the caves support portion 320 is inwardly recessed than the caves pattern portion 310 in the area overlapping the edge of the caves pattern portion 310. Thus, the protective pattern film 330 is not completely etched and is patterned to overlay the edge of the touch sensor contact portion TCT.

In the transparent display panel 110 according to the second embodiment of the present disclosure, as shown in FIGS. 7A and 7B, the undercut region UC3 having the closed loop shape may be formed under the edge of the caves pattern portion 310. The undercut region UC3 may be formed in such a way that the caves support portion 320 corresponding to the edge of the caves pattern portion 310 is patterned more inwardly than the edge of the caves pattern portion 310. The undercut region UC3 may include a portion under the edge of the caves pattern portion 310 and a side surface of the caves support portion 320. An exposed region for exposing at least a portion of the touch sensor contact portion TCT may be formed between the caves support portion 320 having the undercut region UC3 and the protective pattern film 330. The exposed region of the touch sensor contact portion TCT may be formed in the closed loop shape along the periphery of the edge of the caves pattern portion 310 while being corresponding to the formation position of the undercut region UC3.

The light emitting layer 132 may be formed over the caves pattern portion 310 and the protective pattern film 330, and may be disconnectedly provided in the undercut region UC3 formed below the edge of the caves pattern portion 310 disposed above the exposed region of the touch sensor contact portion TCT. The light emitting layer 132 may not be formed in the exposed region of the touch sensor contact portion TCT overlapped with the undercut region UC3, thereby reducing or minimizing the area of the light emitting layer 132 disposed over the exposed region of the touch sensor contact portion TCT.

The touch sensor electrode TSE may be formed over the caves pattern portion 310 and the protective pattern film 330, and may be in contact with the exposed region of the touch sensor contact portion TCT, whereby the touch sensor electrode TSE may be electrically connected to the touch sensor contact portion TCT. The light emitting layer 132 is not in contact with the touch sensor contact portion TCT overlapped with the undercut region UC3, and the touch sensor contact portion TCT is exposed. However, the touch sensor electrode TSE is not overlaid by the light emitting layer 132, and is in direct contact with the exposed upper surface of the touch sensor contact portion TCT, and is electrically connected to the touch sensor contact portion TCT.

The light emitting layer 132 and the touch sensor electrode TSE formed over the upper surface of the caves pattern portion 310 may be disconnectedly provided along the edge where the undercut region UC3 of the caves pattern portion 310 is formed. In this case, the light emitting layer 132 and the touch sensor electrode TSE over the caves pattern portion 310 may be electrically separated from the touch sensor TS.

In the transparent display panel 110 according to the second embodiment of the present disclosure, the contact area of the touch sensor contact portion TCT is formed in the closed loop shape corresponding to the shape of the undercut region UC3 so that it is possible to increase the contact area between the touch sensor electrode TSE and the touch sensor contact portion TCT, and to reduce a resistance between the touch sensor electrode TSE and the touch sensor contact portion TCT, thereby improving reliability of the contact area and reducing a resistance deviation in the entire touch sensor electrode TSE. Accordingly, in the step of detecting defects on the manufacturing process of the transparent display panel 110, it is possible to reduce or minimize misdetection caused by the reduction of the resistance deviation of the touch sensor, thereby improving accuracy of the defect detection.

Third Embodiment

Figure 8A:
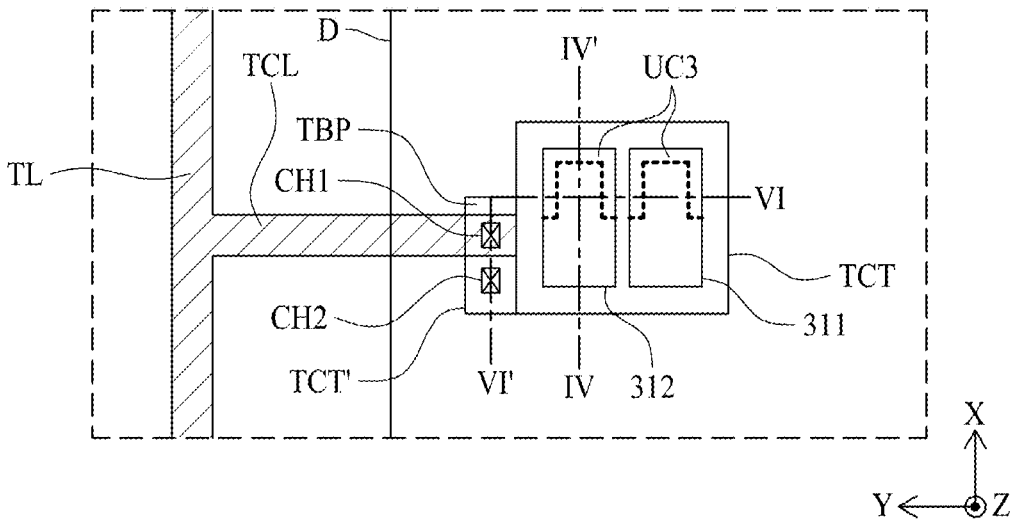
FIG. 8A is a plan view illustrating the third embodiment of a touch sensor contact portion included in the area C of FIG. 3.
Figure 8B:
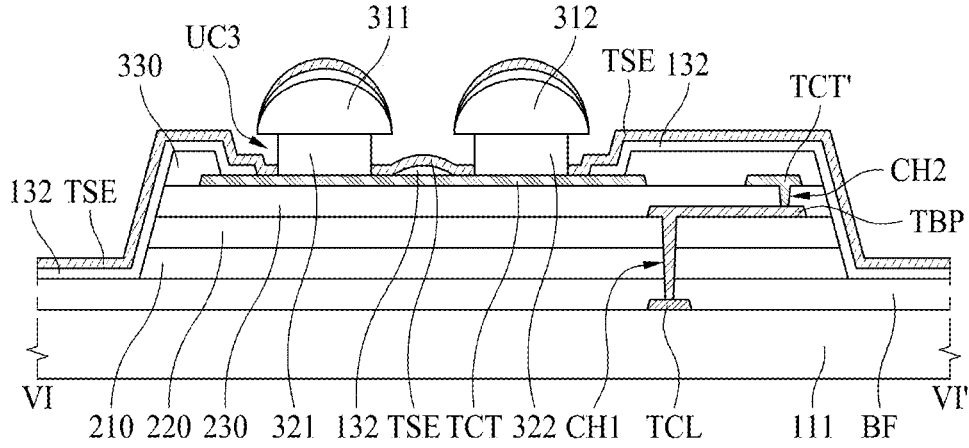
FIG. 8B is a cross-sectional view illustrating an example along VI-VI' of FIG. 8A.

FIG. 8A is a plan view illustrating the third embodiment of the touch sensor contact portion included in the area C of FIG. 3, and FIG. 8B is a cross-sectional view illustrating an example along VI-VI' of FIG. 8A. The cross-sectional view along IV-IV' in FIG. 8A is substantially the same as that of FIG. 6C, whereby a detailed description for the cross-sectional view along IV-IV' is omitted.

Referring to FIGS. 8A and 8B in connection with FIGS. 3 to 5 and FIG. 6C, the transparent display panel 110 according to the third embodiment of the present disclosure may include a touch sensor line TL, a touch sensor connection line TCL, a touch sensor contact portion TCT, a touch sensor bridge pattern TBP, a plurality of support pattern films 210, 220, and 230, a first caves pattern portion 311, a second caves pattern portion 312, a first caves support portion 321, a second caves support portion 322, and a protective pattern film 330.

The transparent display panel 110 according to the third embodiment of the present disclosure shown in FIGS. 8A and 8B has substantially the same configurations as those of the transparent display panel 110 according to the first embodiment of the present disclosure shown in FIGS. 6A to 6C and the transparent display panel 110 according to the second embodiment of the present disclosure shown in FIGS. 7A and 7B except for the caves pattern portion divided into the first and second caves pattern portions 311 and 312, whereby a detailed description for the same configurations will be omitted.

Referring to FIGS. 8A and 8B, the touch sensor contact portion TCT (or touch sensor contact electrode) of the transparent display panel 110 according to the third embodiment of the present disclosure may be disposed over the plurality of support pattern films 210, 220, and 230. Over the touch sensor contact portion TCT, the first caves pattern portion 311, the second caves pattern portion 312, the first caves support portion 321, the second caves support portion 322, and the protective pattern film 330 may be disposed to form an undercut region UC3 which exposes at least a portion of the touch sensor contact portion TCT.

The first and second caves pattern portions 311 and 312 may be disposed over a portion of the touch sensor contact portion TCT. The first and second caves pattern portions 311 and 312 may be spaced apart from each other and may be disposed in parallel to each other above the center of the touch sensor contact portion TCT. Each of the first and second caves pattern portions 311 and 312 is formed in an island pattern, and the undercut region UC3 may be formed under a portion of the edge of the first and second caves pattern portions 311 and 312. For example, the undercut region UC3 may be formed only under the edge located at the upper portion in the entire edge portions of the first caves pattern portion 311, the undercut region UC3 may be formed only under the edge located at the upper portion in the entire edge portions of the second caves pattern portion 312, and the undercut region UC3 may not be formed at the remaining edge portions.

The first caves support portion 321 is overlapped with the first caves pattern portion 311 over the upper surface of the touch sensor contact portion TCT and is configured to support the first caves pattern portion 311. The second caves support portion 322 is overlapped with the second caves pattern portion 312 over the upper surface of the touch sensor contact portion TCT and is configured to support the second caves pattern portion 312. Also, the protective pattern film 330 may be formed to overlay the edge of the touch sensor contact portion TCT. An exposed region for exposing at least a portion of the touch sensor contact portion TCT may be formed between the first and second caves support portions 321 and 322 and the protective pattern film 330. The undercut region UC3 may be at least partially overlapped with the exposed region of the touch sensor contact portion TCT.

The first and second caves support portions 321 and 322 and the protective pattern film 330 may be formed through a wet etching process for the area overlapping a portion of the edge of the first and second eaves pattern portions 311 and 312. The first and second caves support portions 321 and 322 are etched to expose a portion of the upper surface of the touch sensor contact portion TCT. The first and second caves support portions 321 and 322 are provided in such a way that the first and second caves support portions 321 and 322 are inwardly recessed than the first and second caves pattern portions 311 and 312 in the area overlapping a portion of the edge of the first and second caves pattern portions 311 and 312. The protective pattern film 330 is not completely etched and is patterned to overlay the edge of the touch sensor contact portion TCT.

In the transparent display panel 110 according to the third embodiment of the present disclosure, as shown in FIGS. 8A and 8B, the undercut region UC3 may be formed under a portion of the edge of the first and second caves pattern portions 311 and 312. The undercut region UC3 may be formed in such a way that the first and second eaves support portions 321 and 322 corresponding to a portion of the edge of the first and second caves pattern portions 311 and 312 are patterned more inwardly than the edge of the first and second caves pattern portions 311 and 312. The undercut region UC3 may include a portion under a portion of the edge of the first and second caves pattern portions 311 and 312 and a side surface of the first and second caves support portions 321 and 322. An exposed region for exposing at least a portion of the touch sensor contact portion TCT may be formed between the first and second caves support portions 321 and 322 having the undercut region UC3 and the protective pattern film 330. The exposed region of the touch sensor contact portion TCT may be formed in the periphery of a portion of the edge of the first and second caves pattern portions 311 and 312 while being corresponding to the formation position of the undercut region UC3.

The light emitting layer 132 may be formed over the first and second eaves pattern portions 311 and 312 and the protective pattern film 330, and may be disconnectedly provided in the undercut region UC3 formed below a portion of the edge of the first and second caves pattern portions 311 and 312 disposed above the exposed region of the touch sensor contact portion TCT. Accordingly, the light emitting layer 132 may not be formed in the exposed region of the touch sensor contact portion TCT overlapped with the undercut region UC3, thereby reducing or minimizing the area of the light emitting layer 132 disposed over the exposed region of the touch sensor contact portion TCT.

The touch sensor electrode TSE may be formed over the first and second caves pattern portions 311 and 312 and the protective pattern film 330, and may be in contact with the exposed region of the touch sensor contact portion TCT, whereby the touch sensor electrode TSE may be electrically connected to the touch sensor contact portion TCT. The light emitting layer 132 is not in contact with the touch sensor contact portion TCT overlapped with the undercut region UC3, and the touch sensor contact portion TCT is exposed. However, the touch sensor electrode TSE is not overlaid by the light emitting layer 132, and is in direct contact with the exposed upper surface of the touch sensor contact portion TCT, and is electrically connected to the touch sensor contact portion TCT.

In the transparent display panel 110 according to the third embodiment of the present disclosure, the contact area of the touch sensor contact portion TCT is formed in an uneven shape corresponding to the shape of the undercut region UC3 by the first and second caves pattern portions 311 and 312 separated from each other and provided in parallel with each other so that it is possible to increase the contact area between the touch sensor electrode TSE and the touch sensor contact portion TCT, and to reduce a resistance between the touch sensor electrode TSE and the touch sensor contact portion TCT, thereby improving reliability of the contact area and reducing a resistance deviation in the entire touch sensor electrode TSE. Accordingly, in the step of detecting defects on the manufacturing process of the transparent display panel 110, it is possible to reduce or minimize misdetection caused by the reduction of the resistance deviation of the touch sensor, thereby improving accuracy of the defect detection.

Fourth Embodiment

Figure 9:
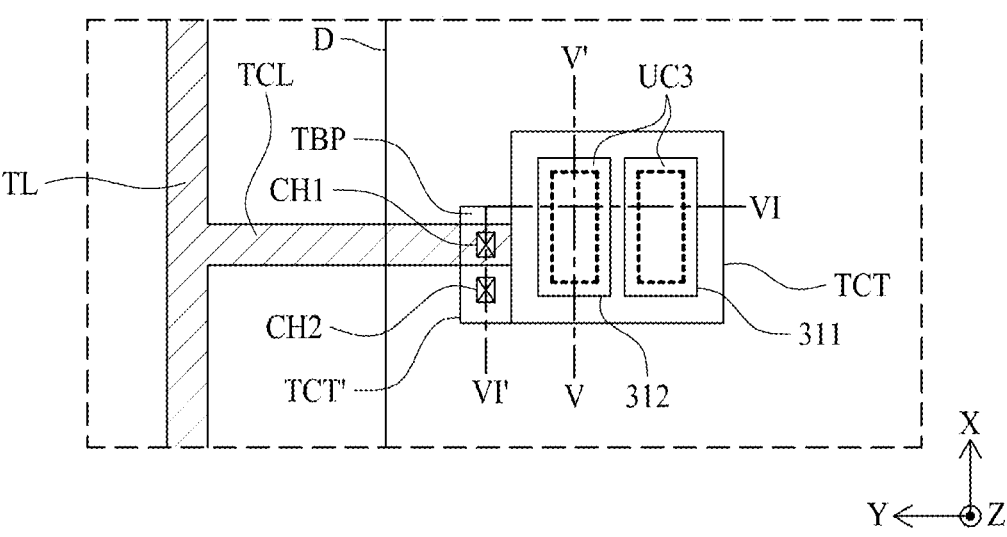
FIG. 9 is a plan view illustrating the fourth embodiment of a touch sensor contact portion included in the area C of FIG. 3.

FIG. 9 is a plan view illustrating the fourth embodiment of the touch sensor contact portion included in the area C of FIG. 3. The cross-sectional view along V-V' in FIG. 9 is substantially the same as that of FIG. 7B, whereby a detailed description for the cross-sectional view along VI-VI' is omitted.

Referring to FIG. 9 in connection with FIGS. 3 to 5 and FIGS. 7B and 8B, the transparent display panel 110 according to the fourth embodiment of the present disclosure may include a touch sensor line TL, a touch sensor connection line TCL, a touch sensor contact portion TCT, a touch sensor bridge pattern TBP, a plurality of support pattern films 210, 220, and 230, a first caves pattern portion 311, a second caves pattern portion 312, a first caves support portion 321, a second caves support portion 322, and a protective pattern film 330.

The transparent display panel 110 according to the fourth embodiment of the present disclosure shown in FIG. 9 has substantially the same configurations as those of the transparent display panel 110 according to the first embodiment of the present disclosure shown in FIGS. 6A to 6C, the transparent display panel 110 according to the second embodiment of the present disclosure shown in FIGS. 7A and 7B, and the transparent display panel 110 according to the third embodiment of the present disclosure shown in FIGS. 8A and 8B except that an caves pattern portion is divided into first and second eaves pattern portions 311 and 312 spaced apart from each other and provided in parallel to each other, and an undercut region is provided in a lattice shape along the edge of the first and second caves pattern portions 311 and 312, whereby a detailed description for the same configurations will be omitted.

Referring to FIG. 9, the touch sensor contact portion TCT (or touch sensor contact electrode) of the transparent display panel 110 according to the fourth embodiment of the present disclosure may be disposed over the plurality of support pattern films 210, 220, and 230. Over the touch sensor contact portion TCT, the first caves pattern portion 311, the second caves pattern portion 312, the first caves support portion 321, the second caves support portion 322, and the protective pattern film 330 may be disposed to form the undercut region UC3 which exposes at least a portion of the touch sensor contact portion TCT.

The first and second caves pattern portions 311 and 312 may be disposed over a portion of the touch sensor contact portion TCT. The first and second caves pattern portions 311 and 312 may be spaced apart from each other and may be disposed in parallel to each other above the center of the touch sensor contact portion TCT. Each of the first and second caves pattern portions 311 and 312 is formed in an island pattern, and the undercut region UC3 may be formed under the edge of the first and second eaves pattern portions 311 and 312. For example, the undercut region UC3 may be formed in the lattice shape along the entire edge of the first and second caves pattern portions 311 and 312.

The first caves support portion 321 is overlapped with the first caves pattern portion 311 over the upper surface of the touch sensor contact portion TCT and is configured to support the first caves pattern portion 311. The second caves support portion 322 is overlapped with the second caves pattern portion 312 over the upper surface of the touch sensor contact portion TCT and is configured to support the second caves pattern portion 312. Also, the protective pattern film 330 may be formed to overlay the edge of the touch sensor contact portion TCT. An exposed region for exposing at least a portion of the touch sensor contact portion TCT may be formed between the first and second caves support portions 321 and 322 and the protective pattern film 330. The undercut region UC3 may be at least partially overlapped with the exposed region of the touch sensor contact portion TCT.

The first and second caves support portions 321 and 322 and the protective pattern film 330 may be formed through a wet etching process for the area overlapping the edge of the first and second caves pattern portions 311 and 312. The first and second caves support portions 321 and 322 are etched to expose a portion of the upper surface of the touch sensor contact portion TCT. The first and second caves support portions 321 and 322 are provided in such a way that the first and second caves support portions 321 and 322 are inwardly recessed than the first and second caves pattern portions 311 and 312 in the area overlapping the edge of the first and second caves pattern portions 311 and 312. The protective pattern film 330 is not completely etched and is patterned to overlay the edge of the touch sensor contact portion TCT.

In the transparent display panel 110 according to the fourth embodiment of the present disclosure, as shown in FIG. 9, the undercut region UC3 may be formed in the lattice shape under the edge of the first and second caves pattern portions 311 and 312. The undercut region UC3 may be formed in such a way that the first and second caves support portions 321 and 322 corresponding to the edge of the first and second caves pattern portions 311 and 312 are patterned more inwardly than the edge of the first and second eaves pattern portions 311 and 312. The undercut region UC3 may include a portion under the edge of the first and second eaves pattern portions 311 and 312 and a side surface of the first and second caves support portions 321 and 322. An exposed region for exposing at least a portion of the touch sensor contact portion TCT may be formed between the first and second caves support portions 321 and 322 having the undercut region UC3 and the protective pattern film 330. The exposed region of the touch sensor contact portion TCT may be formed in the lattice shape along the periphery of the edge of the first and second caves pattern portions 311 and 312 while being corresponding to the formation position of the undercut region UC3.

The light emitting layer 132 may be formed over the first and second caves pattern portions 311 and 312 and the protective pattern film 330, and may be disconnectedly provided in the undercut region UC3 formed below the edge of the first and second caves pattern portions 311 and 312 disposed above the exposed region of the touch sensor contact portion TCT. The light emitting layer 132 may not be formed in the exposed region of the touch sensor contact portion TCT overlapped with the undercut region UC3, thereby reducing or minimizing the area of the light emitting layer 132 disposed over the exposed region of the touch sensor contact portion TCT.

The touch sensor electrode TSE may be formed over the first and second caves pattern portions 311 and 312 and the protective pattern film 330, and may be in contact with the exposed region of the touch sensor contact portion TCT, whereby the touch sensor electrode TSE may be electrically connected to the touch sensor contact portion TCT. The light emitting layer 132 is not in contact with the touch sensor contact portion TCT overlapped with the undercut region UC3, and the touch sensor contact portion TCT is exposed. However, the touch sensor electrode TSE is not overlaid by the light emitting layer 132, and is in direct contact with the exposed upper surface of the touch sensor contact portion TCT, and is electrically connected to the touch sensor contact portion TCT.

The touch sensor electrode TSE and the light emitting layer 132 formed at the first and second caves pattern portions 311 and 312 may be disconnectedly provided along the edge in which the undercut region UC3 of the first and second caves pattern portions 311 and 312 is formed. In this case, the touch sensor electrode TSE and the light emitting layer 132 over the first and second caves pattern portions 311 and 312 may be electrically separated from the touch sensor TS.

In the transparent display panel 110 according to the fourth embodiment of the present disclosure, the contact area of the touch sensor contact portion TCT is formed in the lattice shape corresponding to the shape of the undercut region UC3 by the first and second eaves pattern portions 311 and 312 separated from each other and provided in parallel with each other so that it is possible to increase the contact area between the touch sensor electrode TSE and the touch sensor contact portion TCT, and to reduce a resistance between the touch sensor electrode TSE and the touch sensor contact portion TCT, thereby improving reliability of the contact area and reducing a resistance deviation in the entire touch sensor electrode TSE. Accordingly, in the step of detecting defects on the manufacturing process of the transparent display panel 110, it is possible to reduce or minimize misdetection caused by the reduction of the resistance deviation of the touch sensor, thereby improving accuracy of the defect detection.

Fifth Embodiment

Figure 10A:
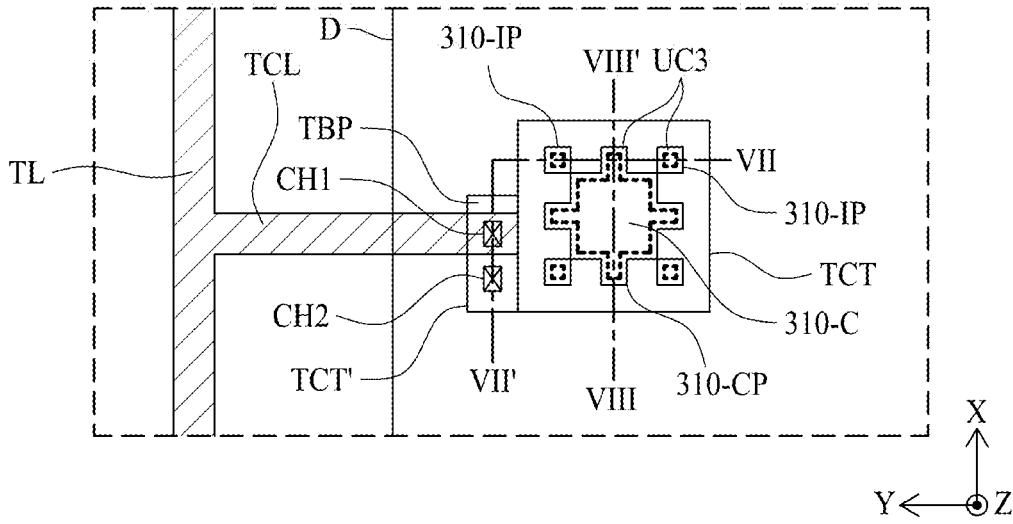
FIG. 10A is a plan view illustrating the fifth embodiment of a touch sensor contact portion included in the area C of FIG. 3.
Figure 10B:
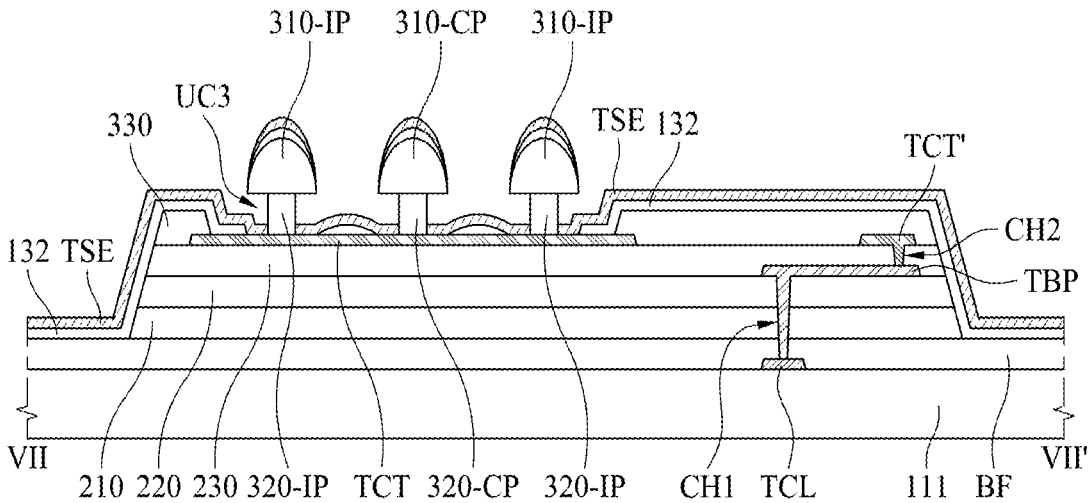
FIG. 10B is a cross-sectional view illustrating an example along VII-VII' of FIG. 10A.
Figure 10C:
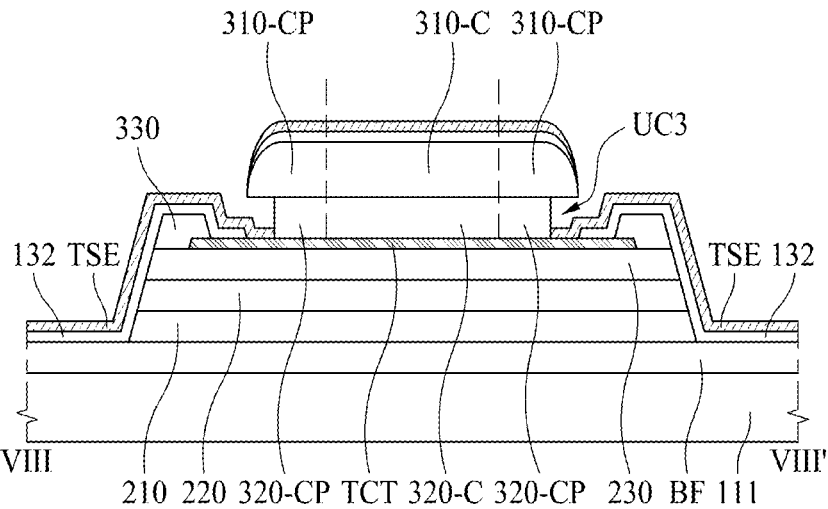
FIG. 10C is a cross-sectional view illustrating an example along VIII-VIII' of FIG. 10A.

FIG. 10A is a plan view illustrating the fifth embodiment of the touch sensor contact portion included in the area C of FIG. 3, FIG. 10B is a cross-sectional view illustrating an example along VII-VII' of FIG. 10A, and FIG. 10C is a cross-sectional view illustrating an example along VIII-VIII' of FIG. 10A.

Referring to FIGS. 10A to 10C in connection with FIGS. 3 to 5, the transparent display panel 110 according to the fifth embodiment of the present disclosure may include a touch sensor line TL, a touch sensor connection line TCL, a touch sensor contact portion TCT, a touch sensor bridge pattern TBP, a plurality of support pattern films 210, 220, and 230, a central caves pattern portion 310-C, a plurality of protruding caves pattern portions 310-IP and 310-CP, a central caves support portion 320-C, a plurality of protruding caves support portions 320-IP and 320-CP, and a protective pattern film 330.

The transparent display panel 110 according to the fifth embodiment of the present disclosure shown in FIGS. 10A to 10C has substantially the same configurations as those of the transparent display panel 110 according to the first embodiment of the present disclosure shown in FIGS. 6A to 6C, the transparent display panel 110 according to the second embodiment of the present disclosure shown in FIGS. 7A and 7B, the transparent display panel 110 according to the third embodiment of the present disclosure shown in FIGS. 8A and 8B, and the transparent display panel 110 according to the fourth embodiment of the present disclosure shown in FIG. 9 except that the caves pattern portion is formed in an uneven shape having recessed and protruding portions repetitively provided along the edge, whereby a detailed description for the same configurations will be omitted.

Referring to FIGS. 10A to 10C, the touch sensor contact portion TCT (or touch sensor contact electrode) of the transparent display panel 110 according to the fifth embodiment of the present disclosure may be disposed over the plurality of support pattern films 210, 220, and 230. Over the touch sensor contact portion TCT, the central caves pattern portion 310-C, the plurality of protruding caves pattern portions 310-IP and 310-CP, the central caves support portion 320-C, the plurality of protruding caves support portions 320-IP and 320-CP, and the protective pattern film 330 may be disposed to form an undercut region UC3 which exposes at least a portion of the touch sensor contact portion TCT.

The central caves pattern portion 310-C and the plurality of protruding caves pattern portions 310-IP and 310-CP may be disposed over a portion of the touch sensor contact portion TCT. The central caves pattern portion 310-C and the plurality of protruding caves pattern portions 310-IP and 310-CP may be formed in the uneven shape having recessed and protruding portions repetitively provided along the edge over the plane above the center of the touch sensor contact portion TCT.

The central caves pattern portion 310-C may be disposed in the center of the uneven shape over the plane, and the plurality of protruding caves pattern portions 310-IP and 310-CP may be disposed in the protruding portion of the uneven shape over the plane. The protruding caves pattern portion 310-IP disposed at each corner over the plane in the plurality of protruding caves pattern portions 310-IP and 310-CP may be formed in an island pattern separated from the central caves pattern portion 310-C. Also, the protruding caves pattern portion 310-CP disposed at each corner over the plane in the plurality of protruding caves pattern portions 310-IP and 310-CP may extend from the central caves pattern portion 310-C, and the central caves pattern portion 310-C and the protruding caves pattern portion 310-CP may be formed as one body in an island pattern. The undercut region UC3 may be formed under the edge of the central eaves pattern portion 310-C and the plurality of protruding caves pattern portions 310-IP and 310-CP. For example, the undercut region UC3 having the uneven shape may be formed along the entire edge of the central caves pattern portion 310-C and the plurality of protruding caves pattern portions 310-IP and 310-CP.

The central caves support portion 320-C may be over-lapped with the central caves pattern portion 310-C over the upper surface of the touch sensor contact portion TCT so that it is possible to support the central caves pattern portion 310-C. The plurality of protruding caves support portions 320-IP and 320-CP may be overlapped with the plurality of protruding caves pattern portions 310-IP and 310-CP over the upper surface of the touch sensor contact portion TCT, to thereby support the plurality of protruding caves pattern portions 310-IP and 310-CP. Also, the protective pattern film 330 may be formed to overlay the edge of the touch sensor contact portion TCT. An exposed region for exposing at least a portion of the touch sensor contact portion TCT may be formed between the central caves support portion 320-C and the plurality of protruding caves support portions 320-IP and 320-CP and the protective pattern film 330. The undercut region UC3 may at least partially overlap the exposed region of the touch sensor contact portion TCT.

The central caves support portion 320-C and the plurality of protruding caves support portions 320-IP and 320-CP and the protective pattern film 330 may be formed through a wet etching process for the area overlapping the edge of the central caves pattern portion 310-C and the plurality of protruding caves pattern portions 310-IP and 310-CP. The central caves support portion 320-C and the plurality of protruding caves support portions 320-IP and 320-CP are etched to expose a portion of the upper surface of the touch sensor contact portion TCT. The central caves support portion 320-C and the plurality of protruding caves support portions 320-IP and 320-CP are provided in such a way that the central caves support portion 320-C and the plurality of protruding caves support portions 320-IP and 320-CP are inwardly recessed than the central caves pattern portion 310-C and the plurality of protruding caves pattern portions 310-IP and 310-CP in the area overlapping the edge of the central caves pattern portion 310-C and the plurality of protruding caves pattern portions 310-IP and 310-CP. The protective pattern film 330 is not completely etched and is patterned to overlay the edge of the touch sensor contact portion TCT.

In the transparent display panel 110 according to the fifth embodiment of the present disclosure, as shown in FIGS.

10A to 10C, the undercut region UC3 may be formed in the uneven shape under the edge of the central caves pattern portion 310-C and the plurality of protruding caves pattern portions 310-IP and 310-CP. The undercut region UC3 may be formed in such a way that the central caves support portion 320-C and the plurality of protruding caves support portions 320-IP and 320-CP corresponding to the edge the central caves pattern portion 310-C and the plurality of protruding caves pattern portions 310-IP and 310-CP are patterned more inwardly than the edge the central caves pattern portion 310-C and the plurality of protruding caves pattern portions 310-IP and 310-CP. The undercut region UC3 may include a portion under the edge of the central caves pattern portion 310-C and the plurality of protruding caves pattern portions 310-IP and 310-CP and a side surface of the central caves pattern portion 310-C and the plurality of protruding caves pattern portions 310-IP and 310-CP. An exposed region for exposing at least a portion of the touch sensor contact portion TCT may be formed between the central caves support portion 320-C and the plurality of protruding caves support portions 320-IP and 320-CP having the undercut region UC3 and the protective pattern film 330. The exposed region of the touch sensor contact portion TCT may be formed in the periphery of the edge of the central caves pattern portion 310-C and the plurality of protruding caves pattern portions 310-IP and 310-CP while being corresponding to the formation position of the undercut region UC3.

The light emitting layer 132 may be formed over the central caves pattern portion 310-C and the plurality of protruding caves pattern portions 310-IP and 310-CP and the protective pattern film 330, and may be disconnectedly provided in the undercut region UC3 formed below the edge of the central caves pattern portion 310-C and the plurality of protruding caves pattern portions 310-IP and 310-CP disposed in the exposed region of the touch sensor contact portion TCT. The light emitting layer 132 may not be formed in the exposed region of the touch sensor contact portion TCT overlapped with the undercut region UC3, thereby reducing or minimizing the area of the light emitting layer 132 disposed over the exposed region of the touch sensor contact portion TCT.

The touch sensor electrode TSE may be formed over the central caves pattern portion 310-C and the plurality of protruding caves pattern portions 310-IP and 310-CP and the protective pattern film 330, and may be in contact with the exposed region of the touch sensor contact portion TCT, whereby the touch sensor electrode TSE may be electrically connected to the touch sensor contact portion TCT. The light emitting layer 132 is not in contact with the touch sensor contact portion TCT overlapped with the undercut region UC3, and the touch sensor contact portion TCT is exposed. However, the touch sensor electrode TSE is not overlaid by the light emitting layer 132, and is in direct contact with the exposed upper surface of the touch sensor contact portion TCT, and is electrically connected to the touch sensor contact portion TCT.

The light emitting layer 132 and the touch sensor elec-trode TSE formed at the upper surface of the central caves pattern portion 310-C and the plurality of protruding caves pattern portions 310-IP and 310-CP may be disconnectedly provided along the edge in which the undercut region UC3 of the central caves pattern portion 310-C and the plurality of protruding caves pattern portions 310-IP and 310-CP is formed. In this case, the light emitting layer 132 and the touch sensor electrode TSE over the central eaves pattern portion 310-C and the plurality of protruding caves pattern portions 310-IP and 310-CP may be electrically separated from the touch sensor TS.

In the transparent display panel 110 according to the fifth embodiment of the present disclosure, the contact area of the touch sensor contact portion TCT is formed in the uneven shape corresponding to the shape of the undercut region UC3 by the central caves pattern portion 310-C and the plurality of protruding caves pattern portions 310-IP and 310-CP so that it is possible to increase the contact area between the touch sensor electrode TSE and the touch sensor contact portion TCT, and to reduce a resistance between the touch sensor electrode TSE and the touch sensor contact portion TCT, thereby improving reliability of the contact area and reducing a resistance deviation in the entire touch sensor electrode TSE. Accordingly, in the step of detecting defects on the manufacturing process of the transparent display panel 110, it is possible to reduce or minimize misdetection caused by the reduction of the resistance deviation of the touch sensor, thereby improving accuracy of the defect detection.

Accordingly, the transparent display device according to the present disclosure may increase the contact area in the contact area for connecting the touch sensor and the touch sensor line. Thus, the transparent display device according to the present disclosure may improve the accuracy of defect detection generated on the manufacturing process of the transparent display device, may reduce the resistance between the touch sensor and the touch sensor line, and may improve the reliability of the contact area.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device, comprising:
a substrate including a non-transmissive area and a transmissive area, the non-transmissive area comprising a light emission area in which a light emitting element is disposed;
a touch sensor disposed at the transmissive area of the substrate;

a touch sensor line disposed at the non-transmissive area of the substrate, the touch sensor line extending in a first direction;
a touch sensor connection line extending in a second direction intersecting the first direction;
at least one power line disposed at the non-transmissive area of the substrate and configured to supply a first power source or a second power source to the light emitting element;
a disconnected portion having an undercut region provided along an edge of the touch sensor electrode in the transmissive area;
a plurality of inorganic insulating films disposed in the non-transmissive area over the substrate and including an inorganic material;
a planarization film disposed in the non-transmissive area over the plurality of inorganic insulating films and including an organic material; and
a cathode contact portion disposed at the transmissive area,
wherein the light emitting element includes a first electrode, a light emitting layer, and a second electrode,
wherein the touch sensor line overlaps at least a portion of the first electrode of the light emitting element,
wherein the at least one power line is disposed in parallel with the touch sensor line in the first direction,
wherein the touch sensor line overlaps the at least one power line,
wherein the at least one power line includes a common power line and a pixel power line,
wherein the cathode contact portion is configured to electrically connect the common power line and the second electrode of the light emitting element,
wherein the second electrode of the light emitting element includes a cathode electrode disposed in the non-transmissive area and configured to form a portion of the light emitting element, and a touch sensor electrode disposed in the transmissive area and configured to form a portion of the touch sensor,
wherein the cathode electrode and the touch sensor electrode are separated from each other by the disconnected portion, and
wherein the undercut region of the disconnected portion is formed such that the planarization film protrudes more than the plurality of inorganic insulating films in the direction of the transmissive area.

2. The transparent display device according to claim 1, further comprising a touch sensor contact portion at the transmissive area, the touch sensor contact portion configured to electrically connect the touch sensor and the touch sensor connection line,
wherein one end of the touch sensor connection line is electrically connected to the touch sensor line, and another end of touch sensor connection line is electrically connected to the touch sensor contact portion.

3. The transparent display device according to claim 1, wherein the at least one power line has a width equal to or wider than that of the touch sensor line.

4. The transparent display device according to claim 1, further comprising a power connection line configured to electrically connect the cathode contact portion and the common power line,
wherein the cathode electrode is electrically connected to the common power line through the cathode contact portion.

5. The transparent display device according to claim 4, further comprising an undercut structure which exposes at least a portion of the cathode contact portion, wherein the cathode electrode is in direct contact with the cathode contact portion exposed by the undercut structure.

6. The transparent display device according to claim 1, further comprising a touch sensor contact portion at the transmissive area, the touch sensor contact portion configured to electrically connect the touch sensor and the touch sensor connection line, wherein the touch sensor contact portion includes an undercut region which exposes at least a portion of the touch sensor contact portion, wherein the undercut region is provided over the touch sensor contact portion, and wherein the touch sensor is in direct contact with the touch sensor contact portion exposed by the undercut region.

7. The transparent display device according to claim 1, further comprising:

a touch sensor contact portion at the transmissive area, the touch sensor contact portion configured to electrically connect the touch sensor and the touch sensor connection line; and a contact structure provided over the touch sensor contact portion, the contact structure having an undercut region which exposes at least a portion of the touch sensor contact portion, wherein the touch sensor is in direct contact with the at least a portion of the touch sensor contact portion exposed by the undercut region, and wherein the contact structure includes at least one of an organic insulating material and an inorganic insulating material.

8. The transparent display device according to claim 1, further comprising:

a touch sensor contact portion at the transmissive area, the touch sensor contact portion configured to electrically connect the touch sensor and the touch sensor connection line; and a protective pattern film formed over the touch sensor contact portion and configured to overlay an edge of the touch sensor contact portion.

9. The transparent display device according to claim 1, further comprising:

a touch sensor contact portion at the transmissive area, the touch sensor contact portion configured to electrically connect the touch sensor and the touch sensor connection line;

a touch sensor bridge pattern between the touch sensor contact portion and the touch sensor connection line; and a plurality of support pattern films overlapped with the touch sensor contact portion in the transmissive area, and including an inorganic material, wherein the touch sensor contact portion is disposed over the plurality of support pattern films, and wherein the plurality of support pattern films includes:

a first support pattern film disposed between the touch sensor line and the touch sensor bridge pattern and configured to include at least one inorganic insulating film; and a second support pattern film disposed between the touch sensor bridge pattern and the touch sensor contact portion.

10. The transparent display device according to claim 9, wherein:

the touch sensor bridge pattern is connected to the touch sensor connection line through a first contact hole formed in the first support pattern film, and the touch sensor contact portion is connected to the touch sensor bridge pattern through a second contact hole formed in the second support pattern film.

11. The transparent display device according to claim 9, wherein the touch sensor contact portion includes:

a touch sensor contact electrode disposed over the plurality of support pattern films; and a contact structure disposed over the touch sensor contact electrode and configured to include an undercut region exposing at least a portion of the touch sensor contact electrode, and wherein the touch sensor is in direct contact with the touch sensor contact electrode exposed by the contact structure.

12. The transparent display device according to claim 1, further comprising:

a touch sensor contact portion at the transmissive area, the touch sensor contact portion configured to electrically connect the touch sensor and the touch sensor connection line; and a contact structure having an undercut region which exposes at least a portion of the touch sensor contact portion, wherein the contact structure includes:

an eaves pattern portion disposed over a portion of the touch sensor contact portion; and an eaves support portion overlapped with at least a portion of the upper surface of the touch sensor contact portion and configured to support the eaves pattern portion, and wherein the undercut region includes a portion under an edge of the eaves pattern portion and adjacent a side surface of the eaves support portion.

13. The transparent display device according to claim 12, further comprising a protective pattern film formed to overlay an edge of the touch sensor contact portion, and including the same material as the eaves support portion, wherein the protective pattern film has a height which is lower than or equal to that of the eaves support portion, and wherein the eaves pattern portion includes an organic insulating material, and the eaves support portion includes an inorganic insulating material.

14. The transparent display device according to claim 1, further comprising:

a touch sensor contact portion at the transmissive area, the touch sensor contact portion configured to electrically connect the touch sensor and the touch sensor connection line;

an eaves pattern portion; and an undercut region which exposes at least a portion of the touch sensor contact portion, wherein the undercut region is formed under at least a portion of an edge of the eaves pattern portion.

15. The transparent display device according to claim 14, wherein the eaves pattern portion includes at least one island pattern, and wherein the undercut region is formed in a closed loop shape along the edge of the eaves pattern portion.

16. The transparent display device according to claim 1, further comprising:

a touch sensor contact portion at the transmissive area, the touch sensor contact portion configured to electrically connect the touch sensor and the touch sensor connection line;

an eaves pattern portion; and an undercut region which exposes at least a portion of the touch sensor contact portion, wherein the eaves pattern portion includes a first eaves pattern portion and a second eaves pattern portion which are spaced apart from each other and are arranged parallel to each other, and wherein the undercut region is formed below at least a portion between the first eaves pattern portion and the second eaves pattern portion.

17. The transparent display device according to claim 16, wherein the first eaves pattern portion and the second eaves pattern portion include island patterns spaced apart from each other.

18. The transparent display device according to claim 16, wherein the undercut region is formed in a lattice shape along an edge of the first eaves pattern portion and the second eaves pattern portion.

19. The transparent display device according to claim 1, further comprising:

a touch sensor contact portion at the transmissive area, the touch sensor contact portion configured to electrically connect the touch sensor and the touch sensor connection line;

an eaves pattern portion; and an undercut region which exposes at least a portion of the touch sensor contact portion, wherein the eaves pattern portion is formed in an uneven shape in which a recessed portion and a protruding portion are repeated along an edge thereof, and wherein the undercut region is formed in an uneven shape under the edge of the eaves pattern portion.

20. The transparent display device according to claim 19, wherein the eaves pattern portion includes an island pattern having the uneven shape.

21. The transparent display device according to claim 19, wherein the protruding portion of the uneven shape is disposed at each corner of the eaves pattern portion.

22. The transparent display device according to claim 19, wherein:

the eaves pattern portion includes a central eaves pattern portion and a plurality of protruding eaves pattern portions corresponding to the protruding portion of the uneven shape along the edge of the central eaves pattern portion, each of the plurality of protruding eaves pattern portions disposed at a respective corner of the eaves pattern portion includes an island pattern separated from the central eaves pattern portion, and the central eaves pattern portion includes an island pattern integrated with the protruding eaves pattern portion disposed between the respective corners in the plurality of protruding eaves pattern portions.

* * * * *